United States Patent
Kocon et al.

(10) Patent No.: US 8,748,976 B1
(45) Date of Patent: Jun. 10, 2014

(54) DUAL RESURF TRENCH FIELD PLATE IN VERTICAL MOSFET

(71) Applicant: Texas Instruments Incorporated, Dallas, TX (US)

(72) Inventors: Christopher Boguslaw Kocon, Mountain Top, PA (US); John Manning Savidge Neilson, Norristown, PA (US); Simon John Molloy, Allentown, PA (US); Hideaki Kawahara, Plano, TX (US); Hong Yang, Richardson, TX (US); Seetharaman Sridhar, Richardson, TX (US); Hao Wu, Chengdu (CN); Boling Wen, Chengdu (CN)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 13/787,044

(22) Filed: Mar. 6, 2013

(51) Int. Cl.
   *H01L 29/66* (2006.01)

(52) U.S. Cl.
   USPC .......................................... 257/330

(58) Field of Classification Search
   CPC ............ H01L 29/66181; H01L 29/945; H01L 29/4236; H01L 29/66704; H01L 29/7397; H01L 29/29713; H01L 29/7825
   USPC .................. 257/330, 329, E29.201, E29.257, 257/E29.26, E29.345, E21.396, 301, 257/E27.091, E27.092; 438/242, 243, 244, 438/259, 270, 386, 387
   See application file for complete search history.

(56) References Cited

U.S. PATENT DOCUMENTS

| | | | |
|---|---|---|---|
| 2006/0267084 A1* | 11/2006 | Rosner et al. | 257/330 |
| 2007/0138544 A1* | 6/2007 | Hirler et al. | 257/330 |
| 2008/0164516 A1* | 7/2008 | Darwish | 257/329 |

* cited by examiner

*Primary Examiner* — Brook Kebede
(74) *Attorney, Agent, or Firm* — Jacqueline J. Garner; Wade J. Brady, III; Frederick J. Telecky, Jr.

(57) ABSTRACT

A semiconductor device contains a vertical MOS transistor with instances of a vertical RESURF trench on opposite sides of a vertical drift region. The vertical RESURF trench contains a dielectric trench liner on sidewalls, and a lower field plate and an upper field plate above the lower field plate. The dielectric trench liner between the lower field plate and the vertical drift region is thicker than between the upper field plate and the vertical drift region. A gate is disposed over the vertical drift region and is separate from the upper field plate. The upper field plate and the lower field plate are electrically coupled to a source electrode of the vertical MOS transistor.

19 Claims, 28 Drawing Sheets

DUAL RESURF TRENCH FIELD PLATE IN VERTICAL MOSFET

FIELD OF THE INVENTION

This invention relates to the field of semiconductor devices. More particularly, this invention relates to vertical MOS transistors in semiconductor devices.

BACKGROUND OF THE INVENTION

Vertical metal oxide semiconductor (MOS) transistors may have a drain below a vertical drift region, and a gate, body and source above the vertical drift region. It may be desirable to reduce the depth of the vertical drift region for a given operating voltage of the MOS transistor.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device contains a vertical MOS transistor with instances of a vertical RESURF trench on opposite sides of a vertical drift region. The vertical RESURF trench contains a dielectric trench liner on sidewalls. The vertical RESURF trench further contains a lower field plate in a lower portion of the vertical RESURF trench and an upper field plate above the lower field plate. The dielectric trench liner between the lower field plate and the vertical drift region is thicker than the dielectric trench liner between the upper field plate and the vertical drift region. A gate is disposed over the vertical drift region and is separate from the upper field plate. The upper field plate and the lower field plate are electrically coupled to a source electrode of the vertical MOS transistor. A method of forming the semiconductor device is disclosed.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

For the purposes of this description, the term "RESURF" will be understood to refer to a material which reduces an electric field in an adjacent semiconductor region. A RESURF region may be for example a semiconductor region with an opposite conductivity type from the adjacent semiconductor region. RESURF structures are described in Appels, et. al., "Thin Layer High Voltage Devices" Philips J, Res. 35 1-13, 1980.

Examples disclosed herein describe n-channel vertical MOS transistors. It will be recognized that corresponding p-channel vertical MOS transistors may be formed with appropriate changes in polarities of dopants and conductivity types.

Figure 1:
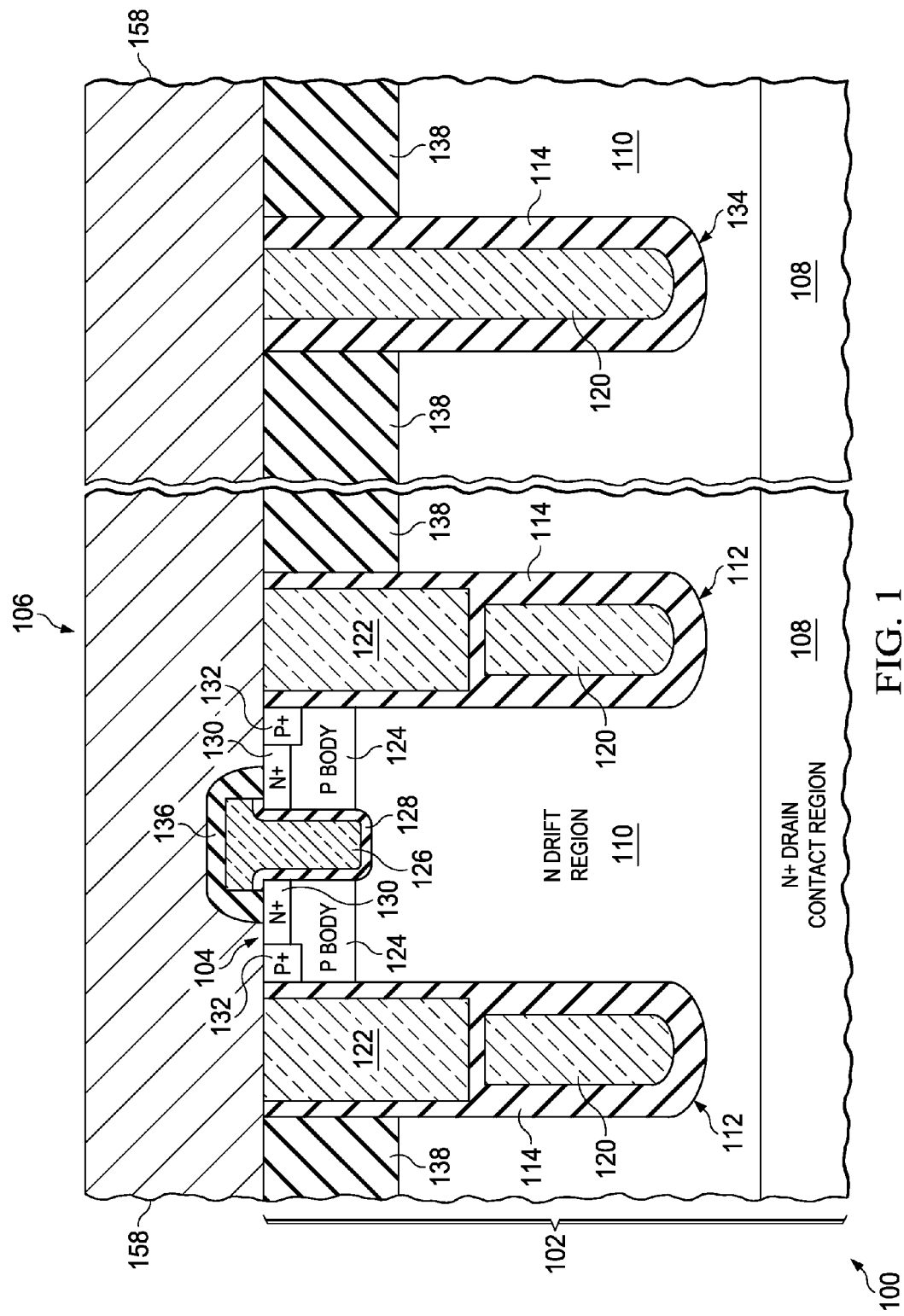
FIG. 1 is a cross section of a semiconductor device containing an exemplary vertical MOS transistor.

FIG. 1 is a cross section of a semiconductor device containing an exemplary vertical MOS transistor. The semiconductor device 100 is formed in and on a substrate 102 which includes a semiconductor extending to a top surface 104 of the substrate 102. The vertical MOS transistor 106 includes an n-type drain contact region 108 disposed in the substrate 102 below an n-type vertical drift region 110 of the vertical MOS transistor 106. The vertical MOS transistor 106 includes at least one vertical RESURF trench 112. An instance of the vertical RESURF trench 112 is disposed on opposite sides of the vertical drift region 110, extending to near the top surface 104 of the substrate 102. The instances of the vertical RESURF trench 112 adjacent to the vertical drift region 110 may be portions of a single vertical RESURF trench 112 or may be separate vertical RESURF trenches 112. Each vertical RESURF trench 112 has a dielectric trench liner 114 disposed on sidewalls and a bottom of the vertical RESURF trench 112. The dielectric trench liner 114 is mostly silicon dioxide, and is free of a silicon nitride or silicon carbide etch stop layer. Each vertical RESURF trench 112 includes a lower field plate 120 on the dielectric trench liner 114 disposed in a lower portion of the vertical RESURF trench 112, which may extend, for example from approximately midway in the vertical RESURF trench 112 to a bottom of the vertical RESURF trench 112. Each vertical RESURF trench 112 further includes an upper field plate 122 on the dielectric trench liner 114 disposed above the lower field plate 120 and which extends to a p-type body region 124 of the vertical MOS transistor 106. The dielectric trench liners 114 are thicker between the lower field plates 120 and the vertical drift region 110 than between the upper field plates 122 and the vertical drift region 110.

The vertical MOS transistor 106 includes a gate 126 disposed on a gate dielectric layer 128 contacting the body region 124. In the instant example, the gate 126 is a trench gate, as depicted in FIG. 1. Other gate configurations, for example planar gates, are within the scope of the instant example. The gate 126 is laterally separated from each adjacent vertical RESURF trench 112 by the semiconductor material of the substrate 102. An n-type source region 130 is disposed abutting the gate dielectric layer 128 and the body region 124 opposite from the vertical drift region 110. A p-type body contact region 132 extends from the top surface 104 of the substrate 102 to the body region 124. A source electrode 158 is electrically coupled to the source region 130, to the body contact region 132, to the upper field plate 122 and to the lower field plate 120. The source electrode 158 may be directly electrically coupled to a top surface of the upper field plate 122 as depicted in FIG. 1. The source electrode 158 may be directly electrically coupled to the lower field plate 120 at an auxiliary trench 134 in which the lower field plate 120 extends to the top surface 104 of the substrate 102. Alternate configurations of electrical coupling between the source electrode 158 and the lower field plate 120 are within the scope of the instant example. The gate 126 is electrically isolated from the source electrode 158, for example by a dielectric gate cap layer 136. The vertical MOS transistor 106 may be laterally isolated in the semiconductor device 100, for example by optional field oxide elements 138. Field oxide elements 138 may be formed by a shallow trench isolation (STI) process or a local oxidation of silicon (LOCOS) process.

During operation of the vertical MOS transistor 106, a combination of the upper field plate 122 and the lower field plate 120 maintain an electric field in the vertical drift region 110 at a desired value with a higher doping density in the vertical drift region 110 compared to a similar vertical MOS transistor with a single field plate. Hence forming the vertical MOS transistor 106 with the combination of the upper field plate 122 and the lower field plate 120 enables the vertical MOS transistor 106 to be smaller than the similar vertical MOS transistor with a single field plate, advantageously reducing a fabrication cost of the semiconductor device 100.

In one version of the instant example, in which the vertical MOS transistor 106 is designed to operate up to 40 volts, the vertical RESURF trenches 112 may be 2.2 microns to 2.8 microns deep and 600 nanometers to 700 nanometers wide. The dielectric trench liner 114 may be 200 nanometers to 250 nanometers thick where contacting the lower field plates 120 and may be 70 nanometers to 80 nanometers thick where contacting the upper field plates 122. The lower field plates 120 and the upper field plates 122 may have an average doping density of $1\times10^{18}$ $cm^{-3}$ to $1\times10^{20}$ $cm^{-3}$. The vertical drift region 110 may be 2.0 microns to 2.6 microns wide and have an average doping density of $2.0\times10^{16}$ $cm^{-3}$ to $2.2\times10^{16}$ $cm^{-3}$.

In another version of the instant example, in which the vertical MOS transistor 106 is designed to operate up to 100 volts, the vertical RESURF trenches 112 may be 6 microns to 7 microns deep and 1.2 microns to 1.4 microns wide. The dielectric trench liner 114 may be 400 nanometers to 500 nanometers thick where contacting the field plates 120 and may be 150 nanometers to 200 nanometers thick where contacting the upper field plates 122. The lower field plates 120 and the upper field plates 122 may have an average doping density of $1\times10^{18}$ $cm^{-3}$ to $1\times10^{20}$ $cm^{-3}$. The vertical drift region 110 may be 2.0 microns to 2.4 microns wide and have an average doping density of $1.8\times10^{16}$ $cm^{-3}$ to $2.0\times10^{16}$ $cm^{-3}$.

In a further version of the instant example, in which the vertical MOS transistor 106 is designed to operate up to 250 volts, the vertical RESURF trenches 112 may be 13 microns to 17 microns deep and 2.5 microns to 2.8 microns wide. The dielectric trench liner 114 may be 900 nanometers to 1000 nanometers thick where contacting the lower field plates 120 and may be 300 nanometers to 400 nanometers thick where contacting the upper field plates 122. The lower field plates 120 and the upper field plates 122 may have an average doping density of $1\times10^{18}$ $cm^{-3}$ to $1\times10^{20}$ $cm^{-3}$. The vertical drift region 110 may be 2.3 microns to 2.7 microns wide and have an average doping density of $1.4\times10^{16}$ $cm^{-3}$ to $1.6\times10^{16}$ $cm^{-3}$.

Figure 2A:
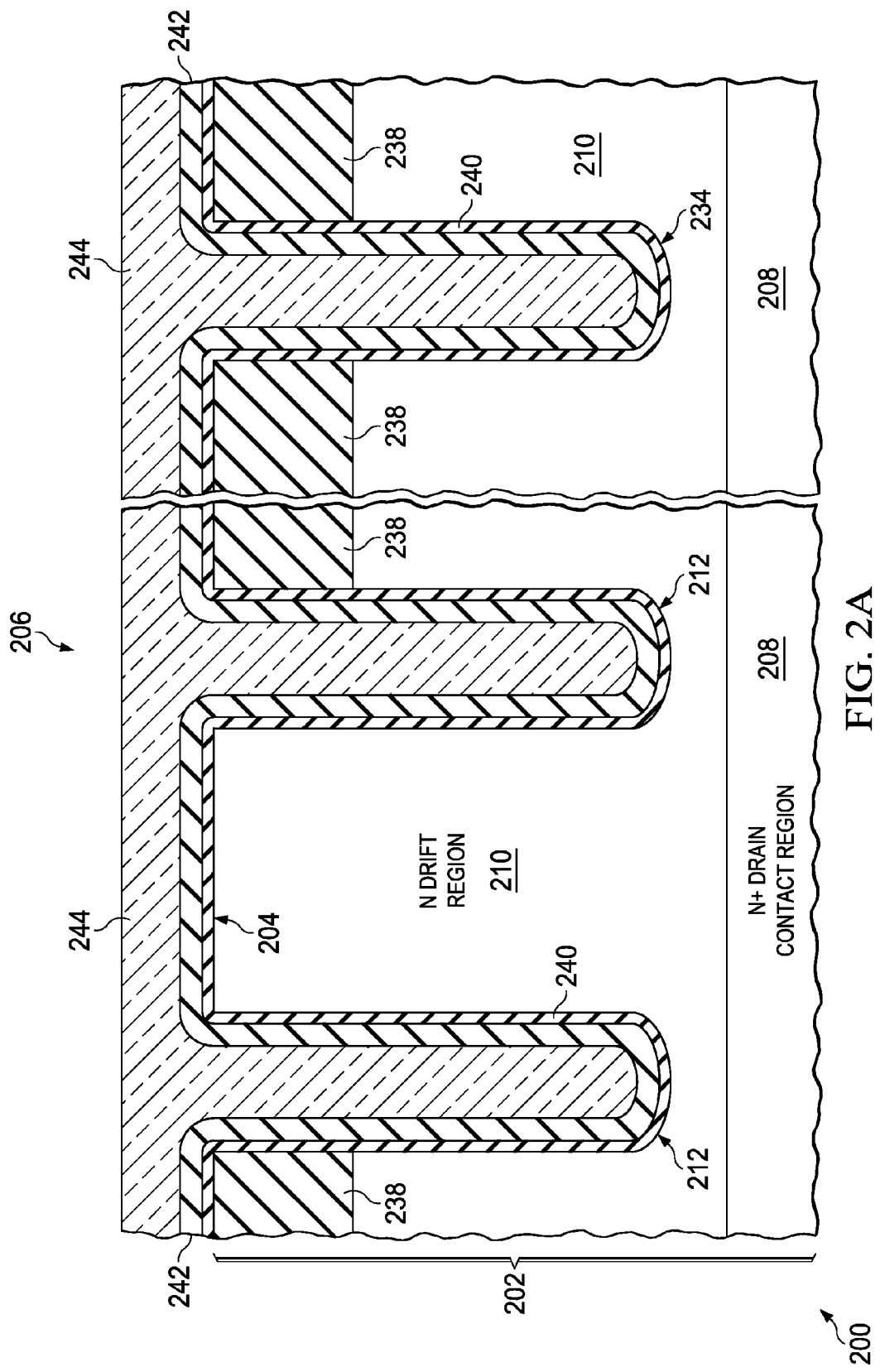
FIG. 2A through FIG. 2H are cross sections of a semiconductor device containing an exemplary vertical MOS transistor, depicted in successive stages of fabrication.

FIG. 2A through FIG. 2H are cross sections of a semiconductor device containing an exemplary vertical MOS transistor, depicted in successive stages of fabrication. Referring to FIG. 2A, the semiconductor device 200 is formed in and on a substrate 202 which includes a semiconductor extending to a top surface 204 of the substrate 202. The vertical MOS transistor 206 includes an n-type drain contact region 208 disposed in the substrate 202 below an n-type vertical drift region 210 of the vertical MOS transistor 206. Optional field oxide elements 238 may be formed at the top surface 204 of the substrate 202.

Vertical RESURF trenches 212 are formed in the substrate 202 on at least two opposite sides of the vertical drift region 210. At least one auxiliary trench 234 is formed in the substrate 202 proximate to the vertical MOS transistor 206, concurrently with the vertical RESURF trenches 212. The vertical RESURF trenches 212 and the auxiliary trench 234 may be formed, for example, by forming a hard mask layer of 250 nanometers to 450 nanometers of silicon dioxide and/or silicon nitride over the top surface 204 of the substrate 202, forming an etch mask of photoresist over the hard mask layer which exposes the hard mask layer in areas for the vertical RESURF trenches 212 and the auxiliary trench 234 and removing the hard mask layer in the exposed areas. Semiconductor material is subsequently removed from the substrate 202 in the areas exposed by the hard mask layer for the vertical RESURF trenches 212 and the auxiliary trench 234. The semiconductor material may be removed from the substrate 202 using a timed reactive ion etch (RIE) process to attain a desired depth of the vertical RESURF trenches 212 and the auxiliary trench 234. The photoresist in the etch mask may be removed by the RIE process. The hard mask layer and any remaining photoresist may be removed after the vertical RESURF trenches 212 and the auxiliary trench 234 are formed.

A first thermal oxide layer 240 is formed at sidewalls and bottom of the vertical RESURF trenches 212 and the auxiliary trench 234, and possibly at the top surface 204 of the substrate 202. The first thermal oxide layer 240 may be 50 nanometers to 200 nanometers thick. A first deposited silicon dioxide layer 242 is formed on the first thermal oxide layer 240. The first deposited silicon dioxide layer 242 may be 200 nanometers to 400 nanometers thick, and may be formed by a sub-atmospheric chemical vapor deposition (SACVD) process using dichlorosilane and oxygen. Alternately, the first deposited silicon dioxide layer 242 may be formed by a plasma enhanced chemical vapor deposition (PECVD) process using tetraethyl orthosilicate, also known as tetraethoxysilane or TEOS. The first deposited silicon dioxide layer 242 may be subsequently densified in an anneal step.

A first polysilicon layer 244 is formed on the first deposited silicon dioxide layer 242 in the vertical RESURF trenches 212 and the auxiliary trench 234 and extending over the top surface 204 of the substrate 202. The first polysilicon layer 244 may be for example, 500 nanometers to 700 nanometers thick over the top surface 204. The first polysilicon layer 244 may be doped, for example with phosphorus, during formation to have an average doping density of $1 \times 10^{18}$ cm$^{-3}$ to $5 \times 10^{18}$ cm$^{-3}$. Alternatively, the first polysilicon layer 244 may be doped by ion implanting dopants, for example phosphorus, at a dose of $1 \times 10^{14}$ cm$^{-2}$ to $5 \times 10^{15}$ cm$^{-2}$, and subsequent annealed at 900° C. to 1000° C. for 10 to 60 minutes.

Figure 2B:
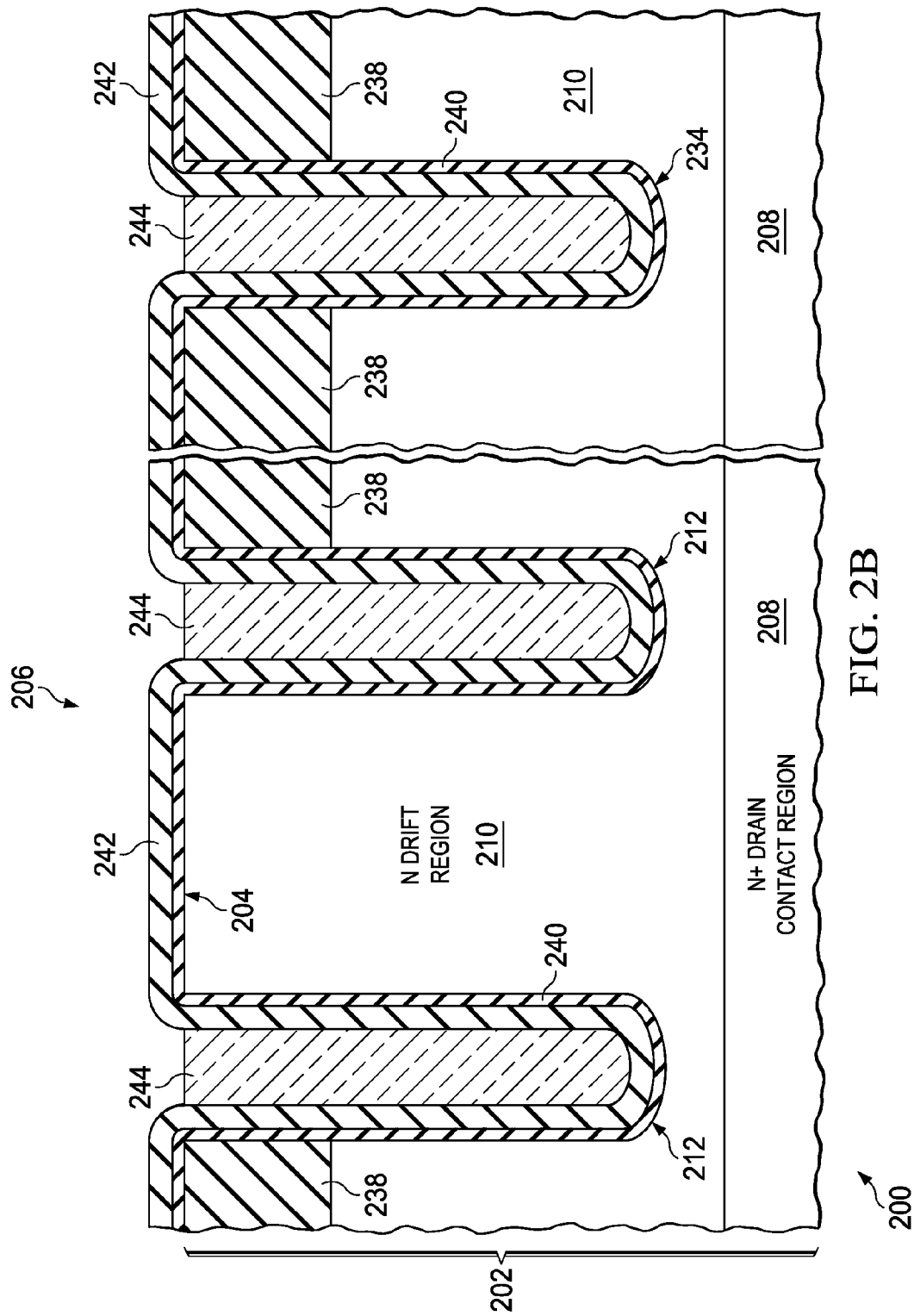

Referring to FIG. 2B, a blanket etchback process removes polysilicon from the first polysilicon layer 244 over the top surface 204 of the substrate 202 so that the first polysilicon layer 244 is within the vertical RESURF trenches 212 and the auxiliary trench 234.

Figure 2C:
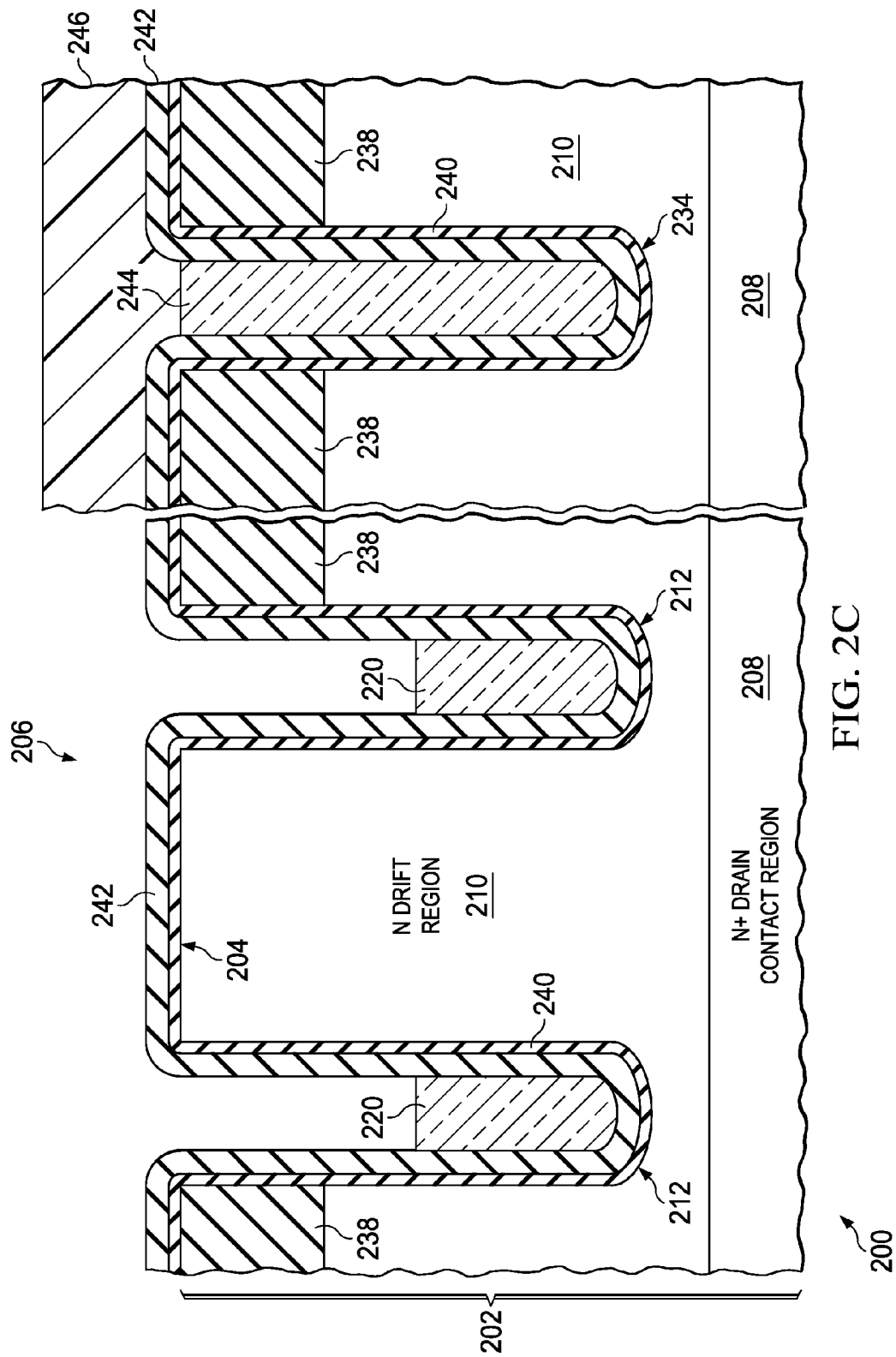

The blanket etchback may be performed, for example, using a plasma etch including fluorine radicals or a wet etch using choline. The first polysilicon layer 244 in the auxiliary trench 234 is contiguous with the first polysilicon layer 244 in the vertical RESURF trenches 212. A top surface of the first polysilicon layer 244 in the auxiliary trench 234 is approximately coplanar, for example within 200 nanometers, with the top surface 204 of the substrate 202. Referring to FIG. 2C, an etchback mask 246 is formed over the auxiliary trench 234 so as to expose the vertical RESURF trenches 212. A polysilicon etch process removes polysilicon from the first polysilicon layer 244 in the vertical RESURF trenches 212 so that remaining polysilicon of the first polysilicon layer 244 forms lower field plates 220 in lower portions of the vertical RESURF trenches 212, which may extend, for example from approximately midway in the vertical RESURF trenches 212 to bottoms of the vertical RESURF trenches 212. The etchback mask 246 prevents removal of polysilicon from the auxiliary trench 234. The etchback mask 246 is removed after the polysilicon etch process is completed.

Figure 2D:
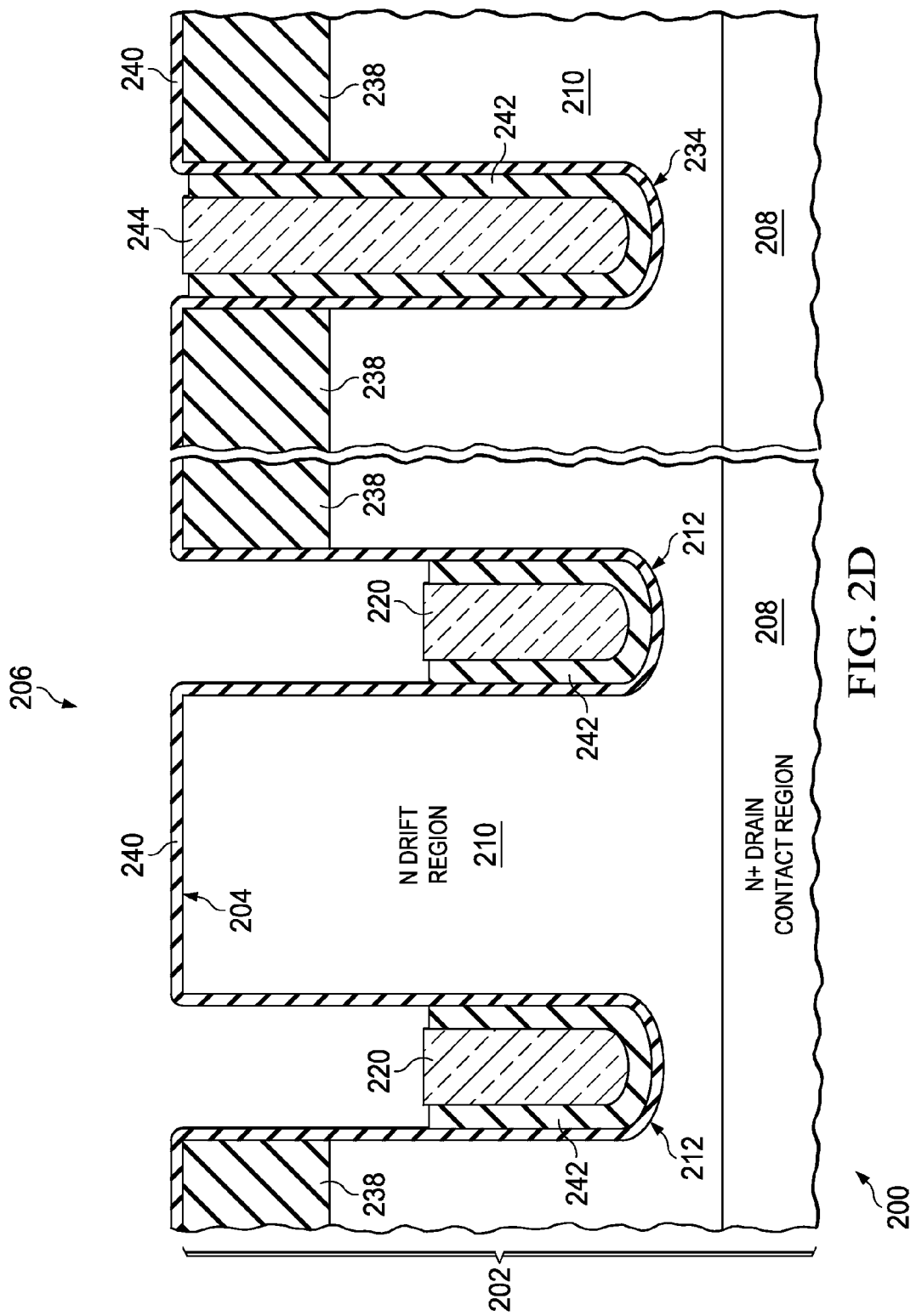

Referring to FIG. 2D, a blanket oxide etchback process removes at least portion, and possibly all, of the first deposited silicon dioxide layer 242 from over the top surface 204 of the substrate 202 and from the vertical RESURF trenches 212 above the lower field plates 220. The lower field plates 220 prevent removal of the first deposited silicon dioxide layer 242 from the vertical RESURF trenches 212 below tops of the lower field plates 220 and the first polysilicon layer 244 prevents removal of the first deposited silicon dioxide layer 242 from the auxiliary trench 234. A majority, and possibly all, of the first thermal oxide layer 240 remains on sidewalls of the vertical RESURF trenches 212 after the blanket oxide etchback process is completed. The blanket oxide etchback process may include, for example, a timed wet etch using a buffered hydrofluoric acid solution. An exemplary buffered hydrofluoric acid solution is 10 parts of 40 percent ammonium fluoride in deionized water and 1 part of 49 percent hydrofluoric acid in deionized water; this exemplary buffered hydrofluoric acid exhibits an etch rate of densified SACVD silicon dioxide that is more than twice an etch rate of thermal oxide.

Figure 2E:
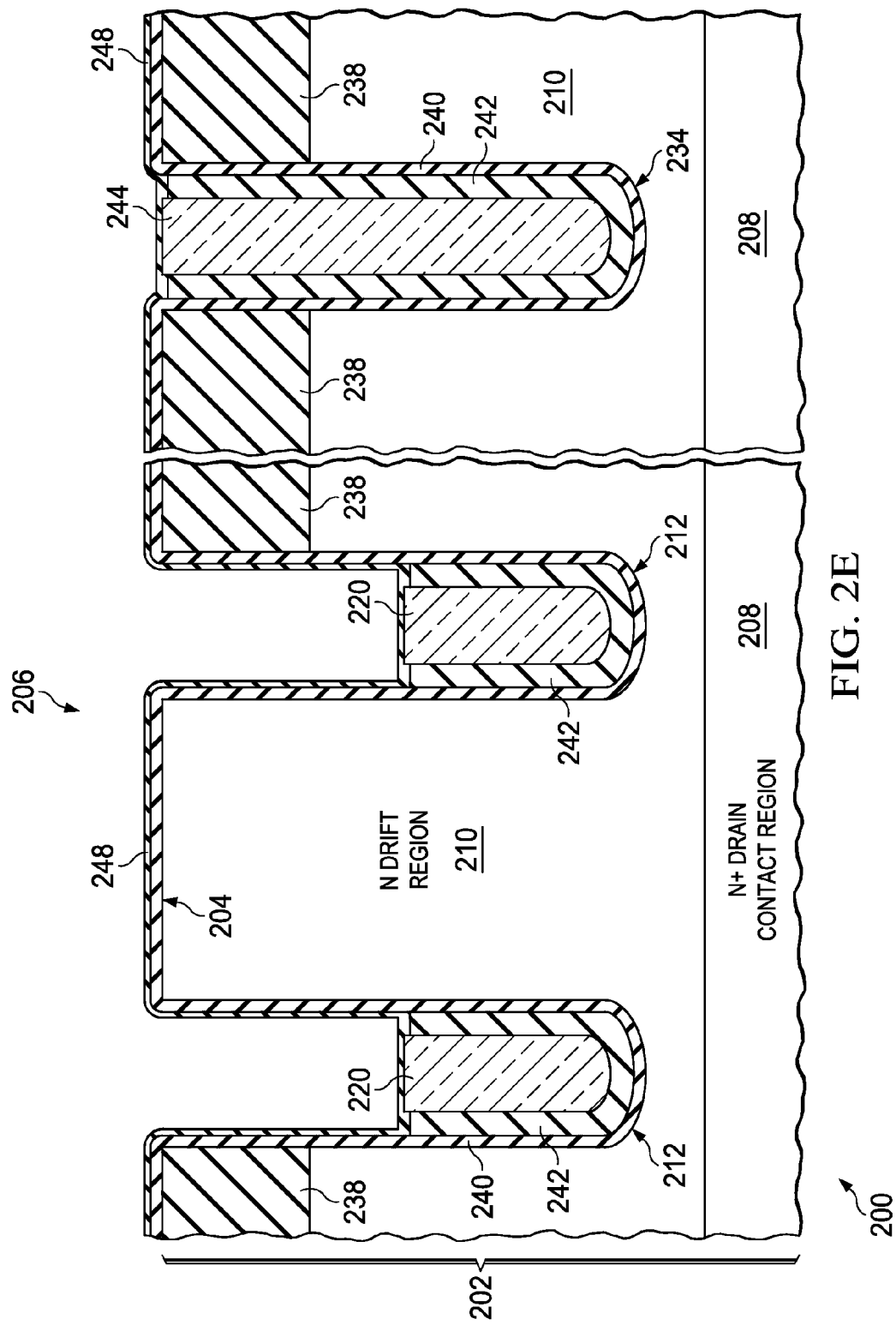

Referring to FIG. 2E, a second deposited silicon dioxide layer 248 is formed over the first thermal oxide layer 240 and over the lower field plates 220. The second deposited silicon dioxide layer 248 may be 160 nanometers to 280 nanometers thick, and may be formed by an SACVD process or a PECVD process. The second deposited silicon dioxide layer 248 may be subsequently densified in an anneal step.

Figure 2F:
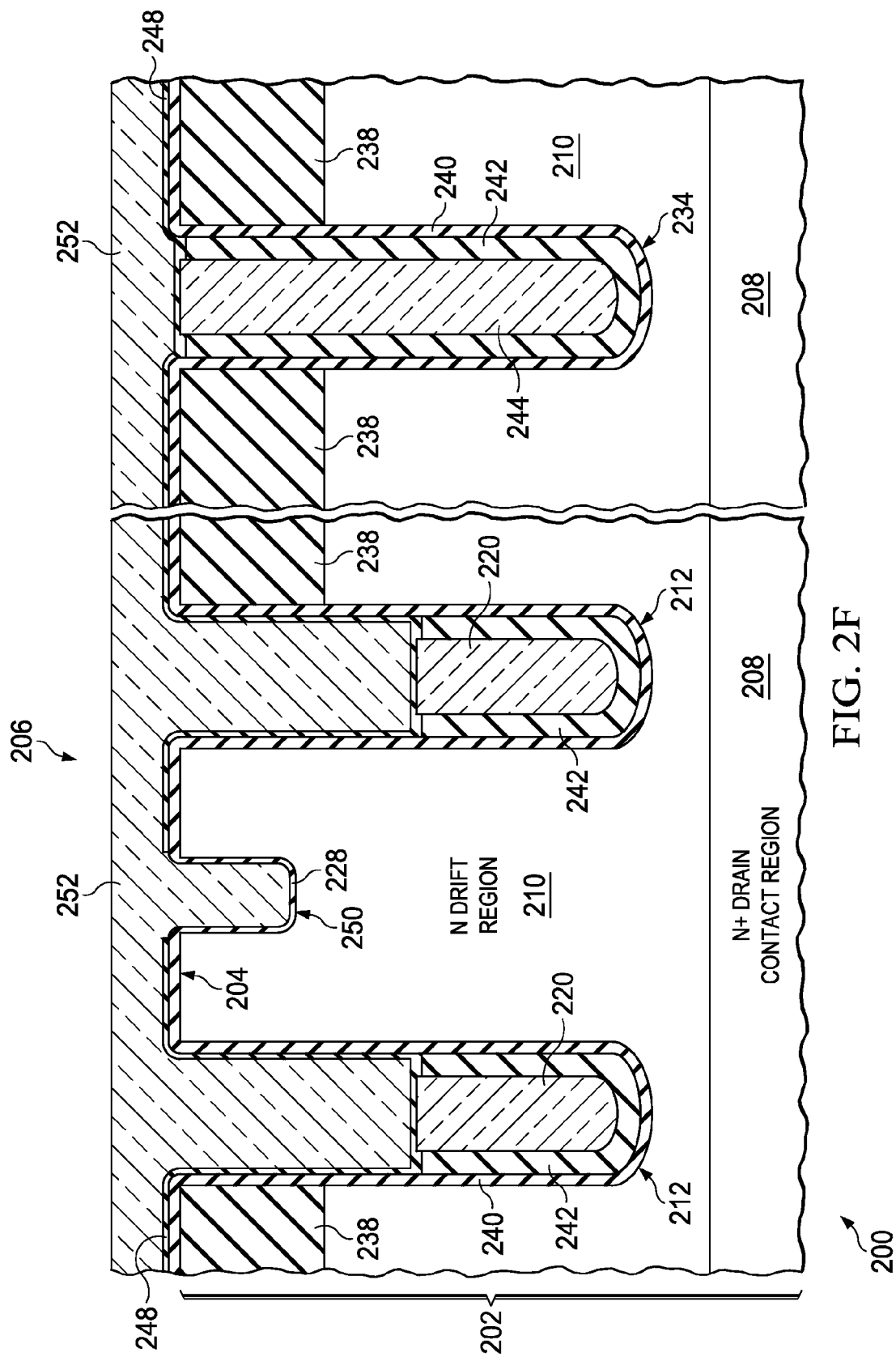

Referring to FIG. 2F, a gate trench 250 is formed in the substrate 202 at the top surface 204 between the vertical RESURF trenches 212. A gate dielectric layer 228 is formed on the substrate 202 in the gate trench 250. A second polysilicon layer 252 is formed on an existing top surface of the semiconductor device 200, in the gate trench 250 and in the vertical RESURF trenches 212. The second polysilicon layer 252 may be for example, 550 nanometers to 700 nanometers thick over the top surface 204. The second polysilicon layer 252 may be doped, for example with phosphorus, during formation to have an average doping density of $1 \times 10^{18}$ cm$^{-3}$ to $5 \times 10^{18}$ cm$^{-3}$. Alternatively, the second polysilicon layer 252 may be doped by ion implanting dopants, for example phosphorus, at a dose of $1 \times 10^{14}$ cm$^{-2}$ to $5 \times 10^{15}$ cm$^{-2}$, and subsequent annealed at 900° C. to 1000° C. for 20 to 60 minutes. The second polysilicon layer 252 is electrically isolated from the lower field plates 220 by the second deposited silicon dioxide layer 248.

Figure 2G:
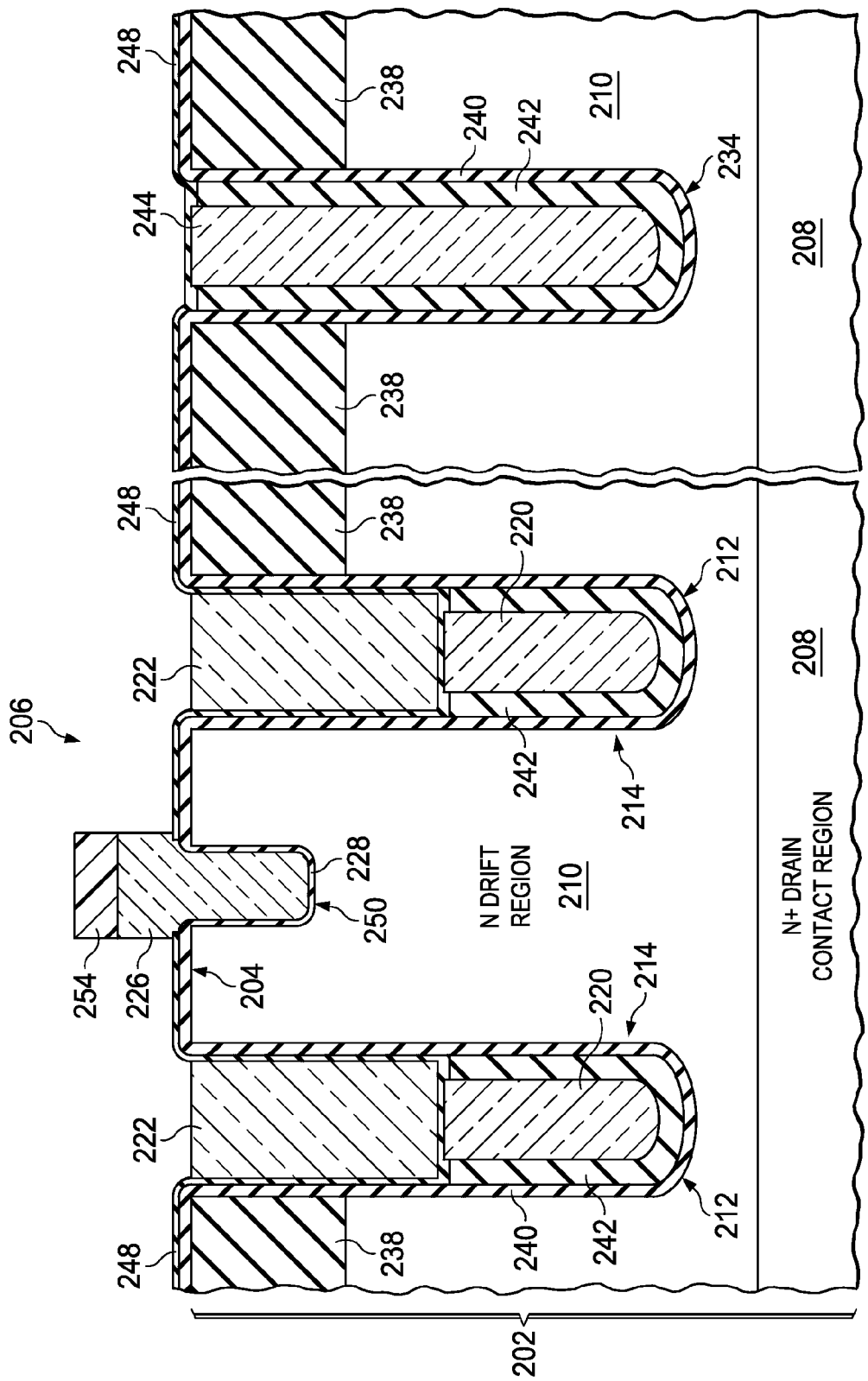

Referring to FIG. 2G, a gate etch mask 254 is formed on the second polysilicon layer 252 of FIG. 2F over the gate trench 250. A gate etch process removes polysilicon from the second polysilicon layer 252 exposed by the gate etch mask 254 to form a gate 226 of the vertical MOS transistor 206. After the gate etch process is completed, a top surface of the second polysilicon layer 252 in the vertical RESURF trenches 212 is approximately coplanar, for example within 200 nanometers, with the top surface 204 of the substrate 202. The second polysilicon layer 252 in the vertical RESURF trenches 212 forms upper field plates 222 which extend upward from the lower field plates 220.

The lower field plates 220 are insulated from the substrate 202 by a combination of the first thermal oxide layer 240 and the first deposited silicon dioxide layer 242. The upper field plates 222 are insulated from the substrate 202 by a combination of the first thermal oxide layer 240 and the second deposited silicon dioxide layer 248. The first thermal oxide layer 240, the first deposited silicon dioxide layer 242, and the second deposited silicon dioxide layer 248 provide dielectric trench liners 214 disposed on sidewalls and a bottom of the vertical RESURF trenches 212. The dielectric trench liner 214 is mostly silicon dioxide, and is free of a silicon nitride or silicon carbide etch stop layer. The dielectric trench liners 214 are thicker between the lower field plates 220 and the vertical drift region 210 than between the upper field plates 222 and the vertical drift region 210. Forming the vertical MOS transistor 206 according to the process sequence described in reference to FIG. 2A through FIG. 2G may provide a desired balance of fabrication simplicity and transistor performance.

Figure 2H:
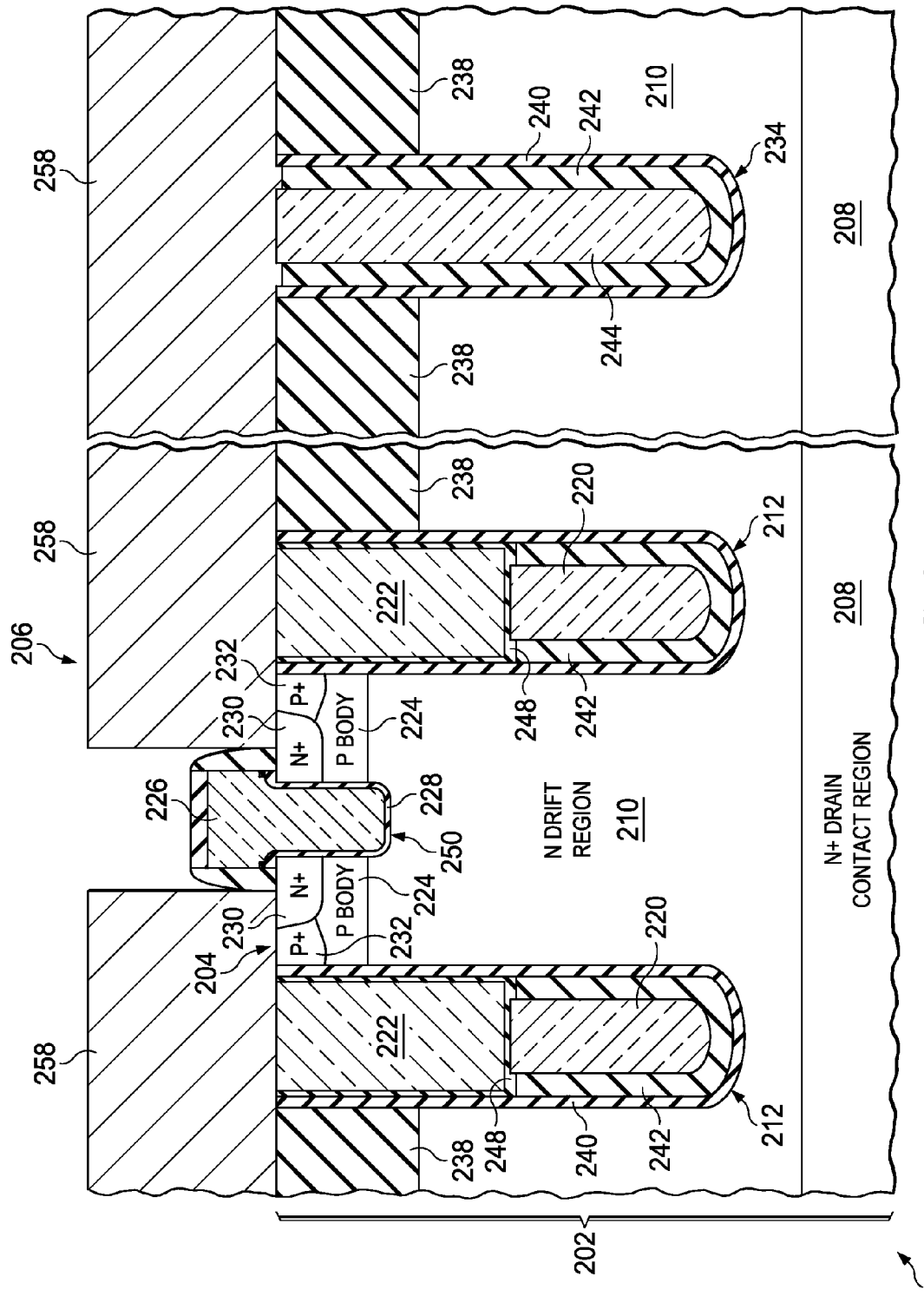

Referring to FIG. 2H, a p-type body region 224 is formed in the substrate 202 abutting the gate trench 250. An n-type source region 230 is formed in the substrate 202 abutting the gate trench 250 opposite from the vertical drift region 210. Heavily doped p-type body contact regions 232 may optionally be formed in the body region 224 at the top surface 204 of the substrate 202.

A source electrode 258 is formed over the substrate 202 so as to make electrical contact to the source region 230 and to the body region 224, through the body contact regions 232 if present. The source electrode 258 further makes electrical contact to the upper field plates 222 at tops of the vertical RESURF trenches 212 and to the first polysilicon layer 244 in the auxiliary trench 234, which is contiguous with the lower field plates 220 in the vertical RESURF trenches 212. The source electrode 258 may include a contact metal layer of one or more layers of titanium and titanium nitride or tantalum nitride in direct contact with the source region 230, the upper field plates 222 and the first polysilicon layer 244 in the auxiliary trench 234. The source electrode 258 may further include a layer of aluminum or copper, for example 1 to 5 microns thick, on the contact metal layer.

Figure 3A:
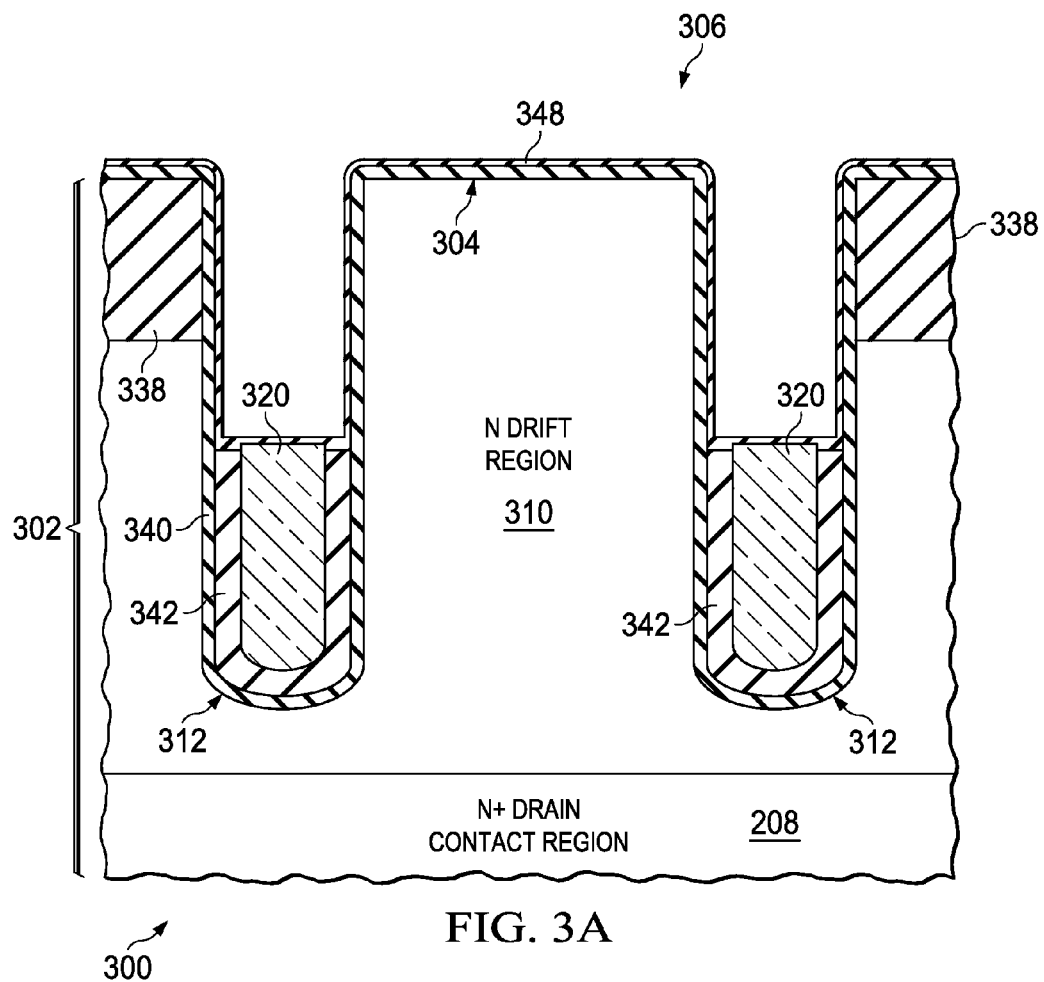
FIG. 3A through FIG. 3D are cross sections of a semiconductor device containing an exemplary vertical MOS transistor, depicted in successive stages of a variation of the fabrication process sequence described in reference to FIG. 2A through FIG. 2H.

FIG. 3A through FIG. 3D are cross sections of a semiconductor device containing an exemplary vertical MOS transistor, depicted in successive stages of a variation of the fabrication process sequence described in reference to FIG. 2A through FIG. 2H. Referring to FIG. 3A, the semiconductor device 300 is formed in and on a substrate 302 which includes a semiconductor extending to a top surface 304 of the substrate 302. The vertical MOS transistor 306 includes an n-type drain contact region 308 disposed in the substrate 302 below an n-type vertical drift region 310 of the vertical MOS transistor 306. Optional field oxide elements 338 may be formed at the top surface 304 of the substrate 302. Vertical RESURF trenches 312 are formed in the substrate 302 on at least two opposite sides of the vertical drift region 310.

A first thermal oxide layer 340 is formed at sidewalls and bottom of the vertical RESURF trenches 312 and possibly at the top surface 304 of the substrate 302. A first deposited silicon dioxide layer 342 is formed on the first thermal oxide layer 340.

Lower field plates 320 are formed in lower portions of the vertical RESURF trenches 312 which extend, for example, from approximately midway in the vertical RESURF trenches 312 to bottoms of the vertical RESURF trenches 312. The lower field plates 320 may be formed using blanket etches instead of the patterned etch process described in reference to FIG. 2C. A blanket oxide etchback process removes at least a portion, and possibly all, of the first deposited silicon dioxide layer 342 from over the top surface 304 of the substrate 302 and from the vertical RESURF trenches 312 above the lower field plates 320, and leaves a majority, and possibly all, of the first thermal oxide layer 340 remains on sidewalls of the vertical RESURF trenches 312.

A second deposited silicon dioxide layer 348 is formed over the first thermal oxide layer 340 and over the lower field plates 320. The second deposited silicon dioxide layer 348 covers a top of the lower field plates 320.

Figure 3B:
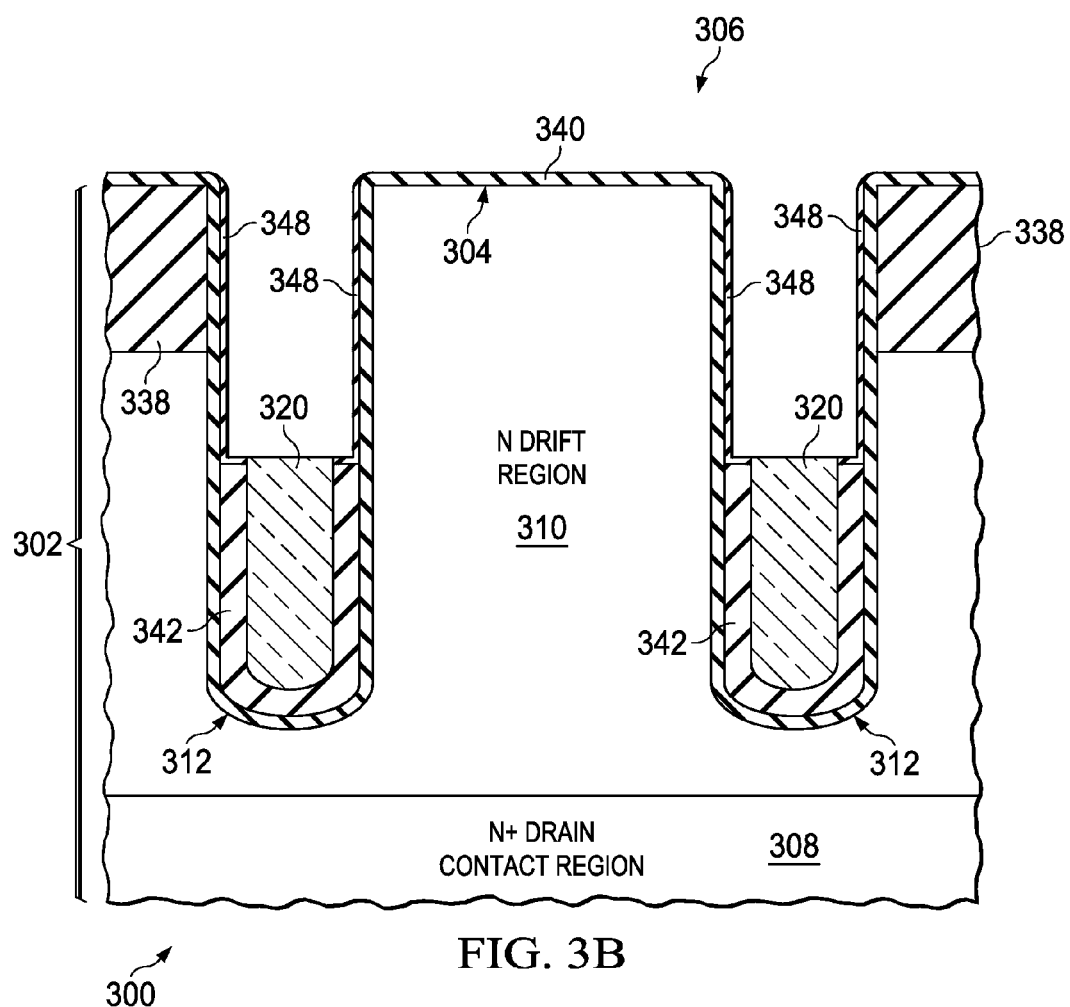

Referring to FIG. 3B, an anisotropic oxide etchback process removes the second deposited silicon dioxide layer 348 from the tops of the lower field plates 320 and leaves a majority portion, and possibly substantially all, of the second deposited silicon dioxide layer 348 on the first thermal oxide layer 340 on the sidewalls of the vertical RESURF trenches 312. The second deposited silicon dioxide layer 348 may be removed from over the top surface 304 of the substrate 302 by the anisotropic oxide etchback process.

Figure 3C:
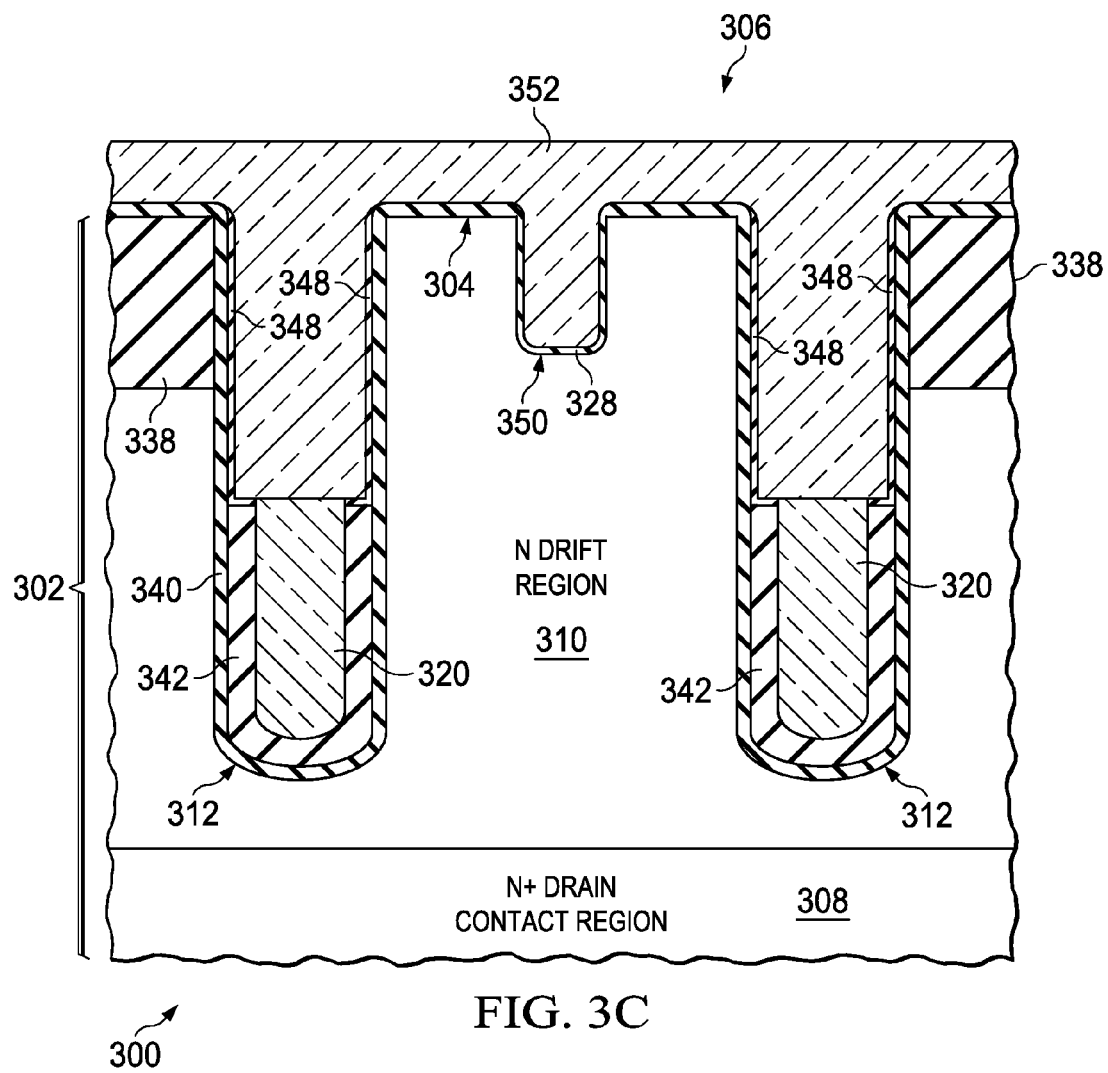

Referring to FIG. 3C, a gate trench 350 is formed in the substrate 302 at the top surface 304 between the vertical RESURF trenches 312. A gate dielectric layer 328 is formed on the substrate 302 in the gate trench 350. A polysilicon layer 352 is formed on an existing top surface of the semiconductor device 300, in the gate trench 350 and in the vertical RESURF trenches 312, as described in reference to FIG. 2F. In the instant example, the polysilicon layer 352 makes electrical contact to the tops of the lower field plates 320.

Figure 3D:
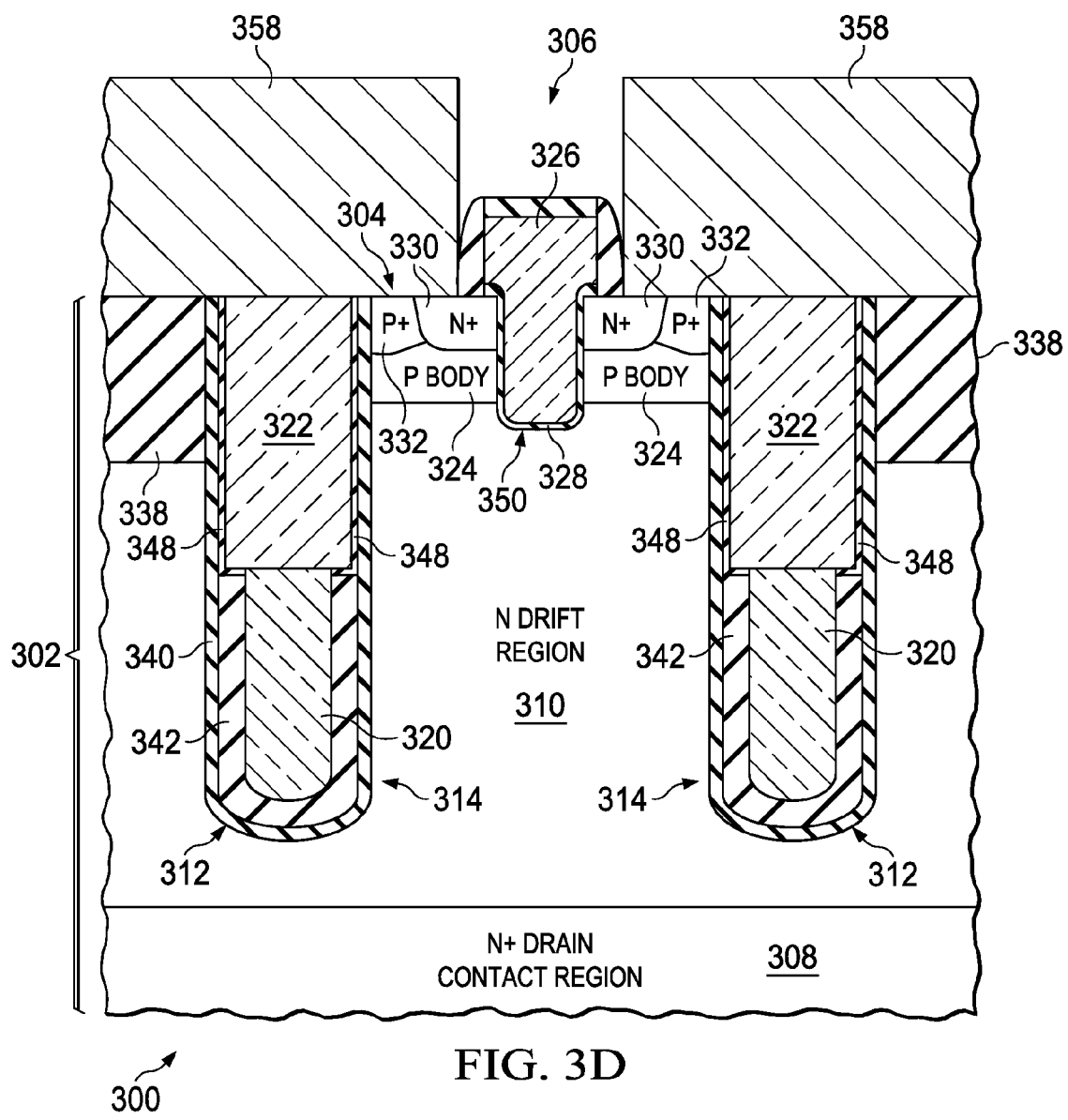

Referring to FIG. 3D, fabrication of the semiconductor device is continued as described in reference to FIG. 2H. A polysilicon etchback process removes the polysilicon layer 352 of FIG. 3C from over the top surface 304 of the substrate 302 to form upper field plates 322 in the vertical RESURF trenches 312 which extend upward from the lower field plates 320, and a gate 326 is formed in the gate trench 350, of the polysilicon layer 352 of FIG. 3C. The lower field plates 320 are insulated from the substrate 302 by a combination of the first thermal oxide layer 340 and the first deposited silicon dioxide layer 342. The upper field plates 322 are insulated from the substrate 302 by a combination of the first thermal oxide layer 340 and the second deposited silicon dioxide layer 348. The first thermal oxide layer 340, the first deposited silicon dioxide layer 342, and the second deposited silicon dioxide layer 348 provide dielectric trench liners 314 disposed on sidewalls and a bottom of the vertical RESURF trenches 312. The dielectric trench liner 314 is mostly silicon dioxide, and is free of a silicon nitride or silicon carbide etch stop layer. The dielectric trench liners 314 are thicker between the lower field plates 320 and the vertical drift region 310 than between the upper field plates 322 and the vertical drift region 310.

A p-type body region 324 is formed in the substrate 302 abutting the gate trench 350. An n-type source region 330 is formed in the substrate 302 abutting the gate trench 350 opposite from the vertical drift region 310. Heavily doped p-type body contact regions 332 may optionally be formed in the body region 324 at the top surface 304 of the substrate 302. A source electrode 358 is formed over the substrate 302 so as to make electrical contact to the source region 330 and to the body region 324, through the body contact regions 332 if present. The source electrode 358 further makes electrical contact to the upper field plates 322 at tops of the vertical RESURF trenches 312. In the instant embodiment, the upper field plates 322 make direct electrical connection to the lower field plates 320, which may advantageously reduce an area required for the semiconductor device 300.

Figure 4A:
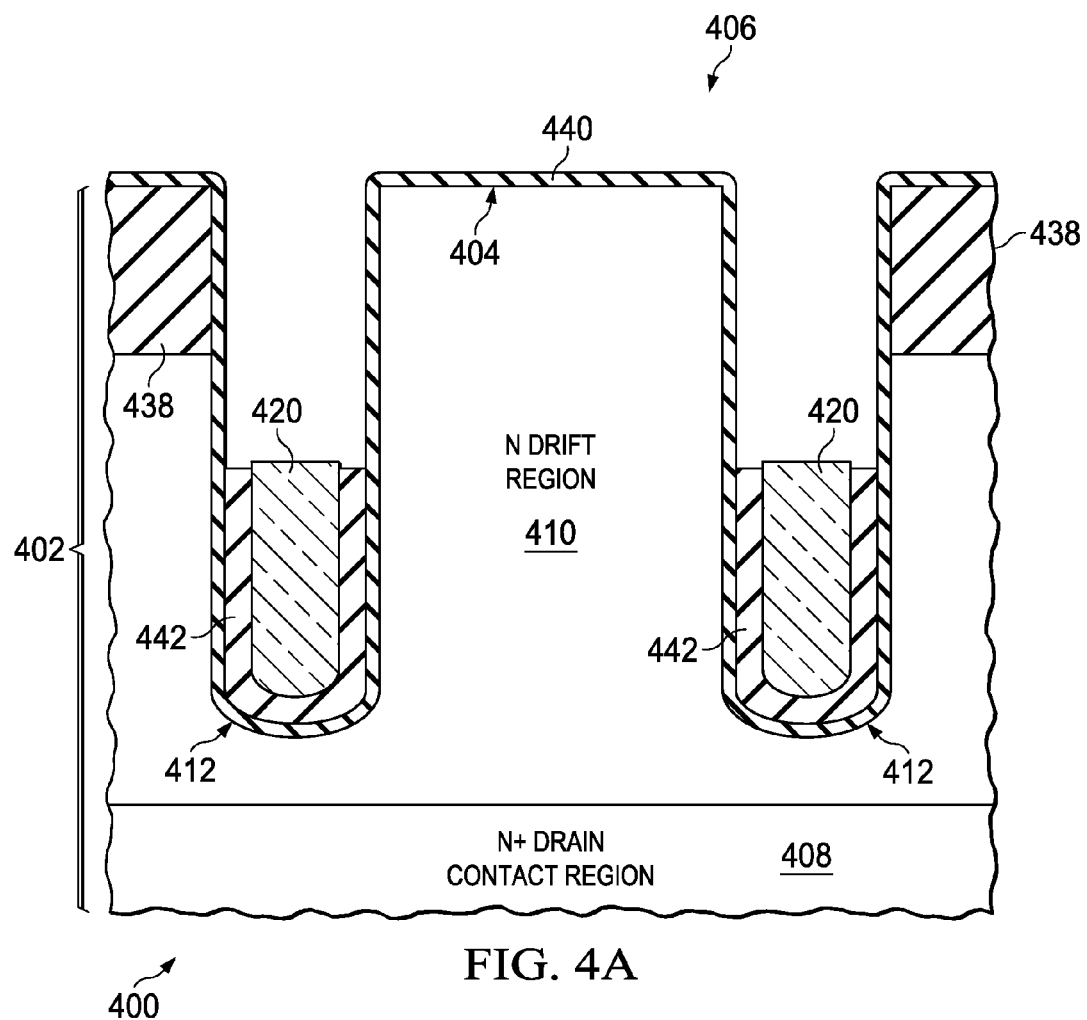
FIG. 4A through FIG. 4C are cross sections of a semiconductor device containing an exemplary vertical MOS transistor, depicted in successive stages of another variation of the fabrication process sequence described in reference to FIG. 2A through FIG. 2H.
Figure 4B:
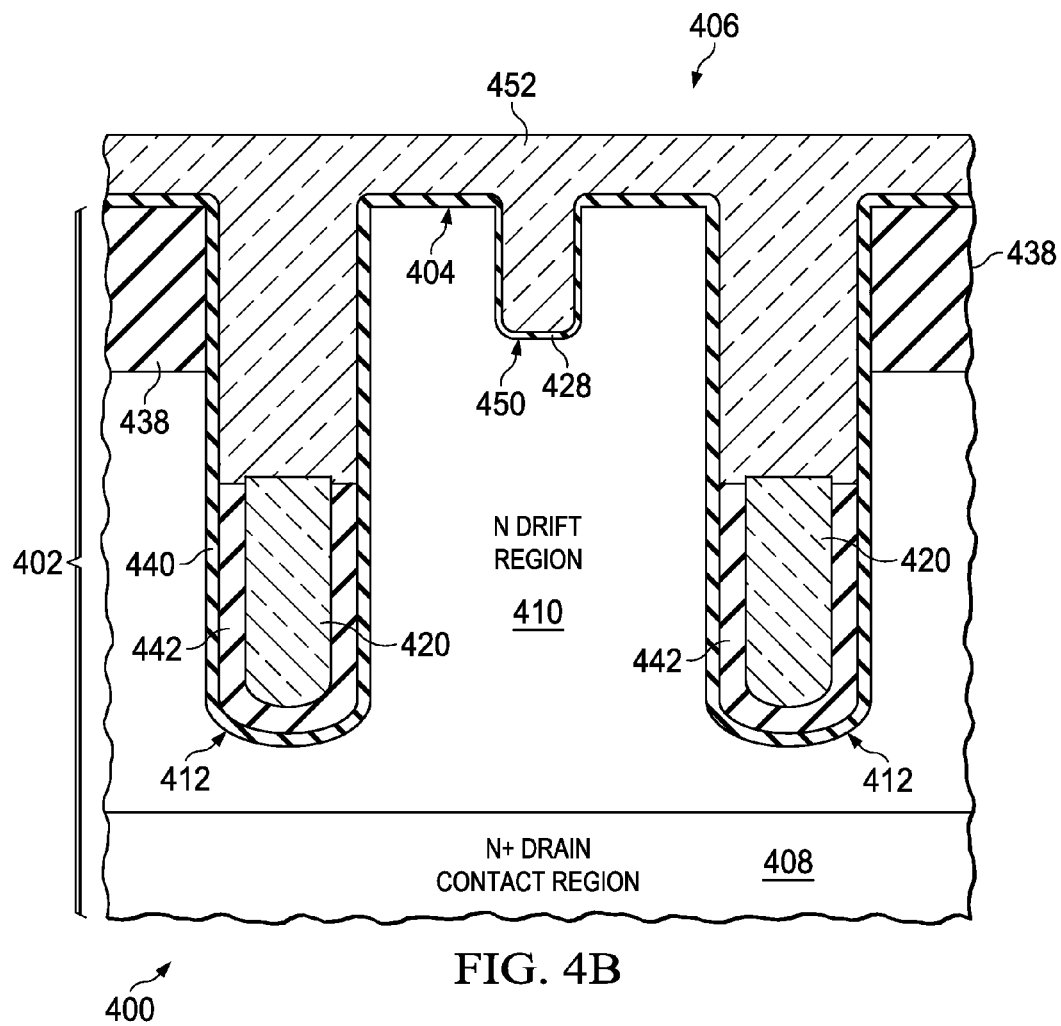
Figure 4C:
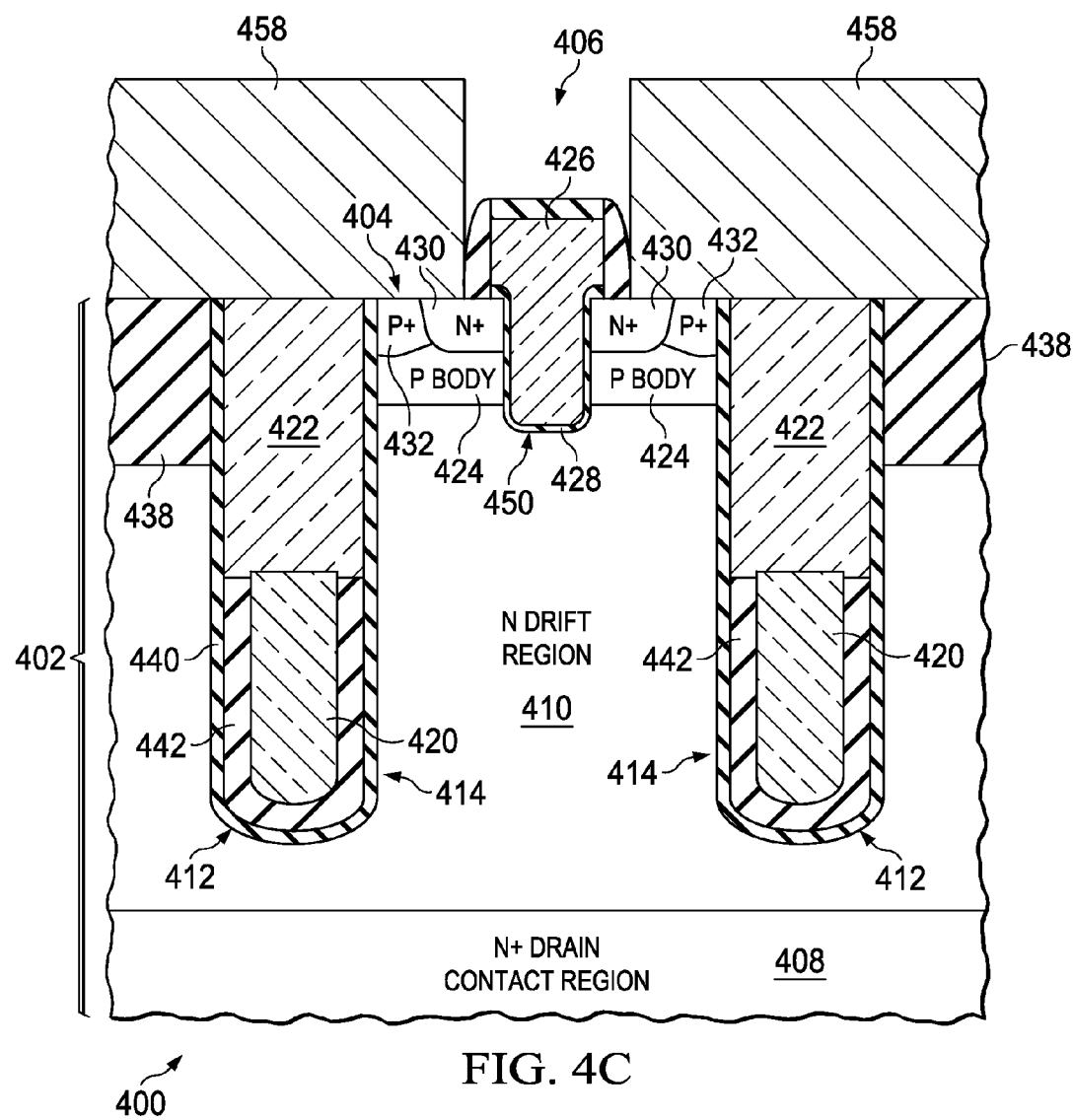

FIG. 4A through FIG. 4C are cross sections of a semiconductor device containing an exemplary vertical MOS transistor, depicted in successive stages of another variation of the fabrication process sequence described in reference to FIG. 2A through FIG. 2H. Referring to FIG. 3A, the semiconductor device 400 is formed in and on a substrate 402 which includes a semiconductor extending to a top surface 404 of the substrate 402. The vertical MOS transistor 406 includes an n-type drain contact region 408 disposed in the substrate 402 below an n-type vertical drift region 410 of the vertical MOS transistor 406. Optional field oxide elements 438 may be formed at the top surface 404 of the substrate 402. Vertical RESURF trenches 412 are formed in the substrate 402 on at least two opposite sides of the vertical drift region 410.

A first thermal oxide layer 440 is formed at sidewalls and bottom of the vertical RESURF trenches 412 and possibly at the top surface 404 of the substrate 402. The first thermal oxide layer 440 of the instant example is thicker than the first thermal oxides 240 and 340 of the previous examples. In the instant example, the first thermal oxide layer 440 may be, for example, 240 nanometers to 440 nanometers thick. A first deposited silicon dioxide layer 442 is formed on the first thermal oxide layer 440. Lower field plates 420 are formed in lower portions of the vertical RESURF trenches 412 which may extend, for example, from approximately midway in the vertical RESURF trenches 412 to bottoms of the vertical RESURF trenches 412. The lower field plates 420 may be formed using blanket etches instead of the patterned etch process described in reference to FIG. 2C. A blanket oxide etchback process removes at least a portion, and possibly all, of the first deposited silicon dioxide layer 442 from over the top surface 404 of the substrate 402 and from the vertical RESURF trenches 412 above the lower field plates 420, and leaves a majority, and possibly all, of the first thermal oxide layer 440 remains on sidewalls of the vertical RESURF trenches 412.

Referring to FIG. 4B, a gate trench 450 is formed in the substrate 402 at the top surface 404 between the vertical RESURF trenches 412. A gate dielectric layer 428 is formed on the substrate 402 in the gate trench 450. A polysilicon layer 452 is formed on an existing top surface of the semiconductor device 400, in the gate trench 450 and in the vertical RESURF trenches 412. In the instant example, the polysilicon layer 452 makes electrical contact to the tops of the lower field plates 420.

Referring to FIG. 4C, fabrication of the semiconductor device is continued as described in reference to FIG. 3C. Upper field plates 422 are formed in the vertical RESURF trenches 412 above the lower field plates 420, and a gate 426 is formed in the gate trench 450, of the polysilicon layer 452 of FIG. 4B. The lower field plates 420 are insulated from the substrate 402 by a combination of the first thermal oxide layer 440 and the first deposited silicon dioxide layer 442. The upper field plates 422 are insulated from the substrate 402 by the first thermal oxide layer 440. The first thermal oxide layer 440 and the first deposited silicon dioxide layer 442 provide dielectric trench liners 414 disposed on sidewalls and a bottom of the vertical RESURF trenches 412. The dielectric trench liner 414 is mostly silicon dioxide, and is free of a silicon nitride or silicon carbide etch stop layer. The dielectric trench liners 414 are thicker between the lower field plates 420 and the vertical drift region 410 than between the upper field plates 422 and the vertical drift region 410.

A p-type body region 424 is formed in the substrate 402 abutting the gate trench 450. An n-type source region 430 is formed in the substrate 402 abutting the gate trench 450 opposite from the vertical drift region 410. Heavily doped p-type body contact regions 432 may optionally be formed in the body region 424 at the top surface 404 of the substrate 402. A source electrode 458 is formed over the substrate 402 so as to make electrical contact to the source region 430 and to the body region 424, through the body contact regions 432 if present. The source electrode 458 further makes electrical contact to the upper field plates 422 at tops of the vertical RESURF trenches 412. In the instant embodiment, the upper field plates 422 make direct electrical connection to the lower field plates 420, which may advantageously reduce an area required for the semiconductor device 400.

The lower field plates 420 are insulated from the substrate 402 by a combination of the first thermal oxide layer 440 and the first deposited silicon dioxide layer 442. The upper field plates 422 are insulated from the substrate 402 by the first thermal oxide layer 440, which may provide a desired fabrication simplicity of the semiconductor device 400.

Figure 5A:
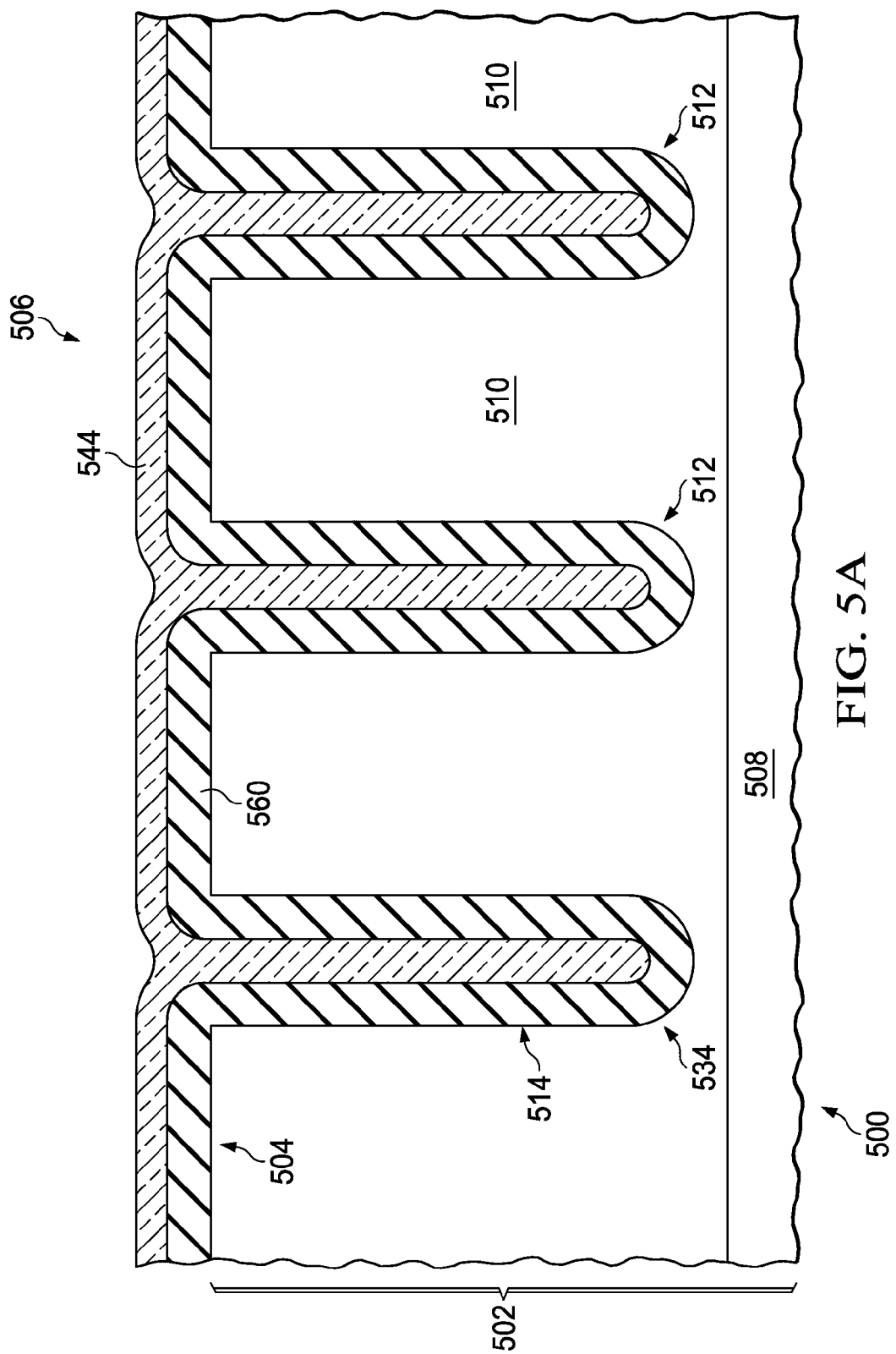
FIG. 5A through FIG. 5H are cross sections of a semiconductor device containing another exemplary vertical MOS transistor, depicted in successive stages of fabrication.

FIG. 5A through FIG. 5H are cross sections of a semiconductor device containing another exemplary vertical MOS transistor, depicted in successive stages of fabrication. Referring to FIG. 5A, the semiconductor device 500 is formed in and on a substrate 502 which includes a semiconductor extending to a top surface 504 of the substrate 502. The vertical MOS transistor 506 includes an n-type drain contact region 508 disposed in the substrate 502 below an n-type vertical drift region 510 of the vertical MOS transistor 506.

Vertical RESURF trenches 512 are formed in the substrate 502 on at least two opposite sides of the vertical drift region 510. At least one auxiliary trench 534 is formed in the substrate 502 proximate to the vertical MOS transistor 506, concurrently with the vertical RESURF trenches 512. The vertical RESURF trenches 512 and the auxiliary trench 534 may be formed as described in reference to FIG. 2A.

A first dielectric portion 560 of a dielectric trench liner 514 is formed at sidewalls and bottom of the vertical RESURF trenches 512 and the auxiliary trench 534, and at the top surface 504 of the substrate 502. The first dielectric portion 560 includes, for example, a first thermal oxide layer 50 nanometer to 200 nanometers thick, and a first deposited silicon dioxide layer 200 nanometers to 400 nanometers thick, formed on the first thermal oxide layer.

A first polysilicon layer 544 is formed on the first dielectric portion 560 in the vertical RESURF trenches 512 and the auxiliary trench 534 and extending over the top surface 504 of the substrate 502, as described in reference to FIG. 2A. The first polysilicon layer 544 may be, for example, 550 nanometers to 700 nanometers thick.

Figure 5B:
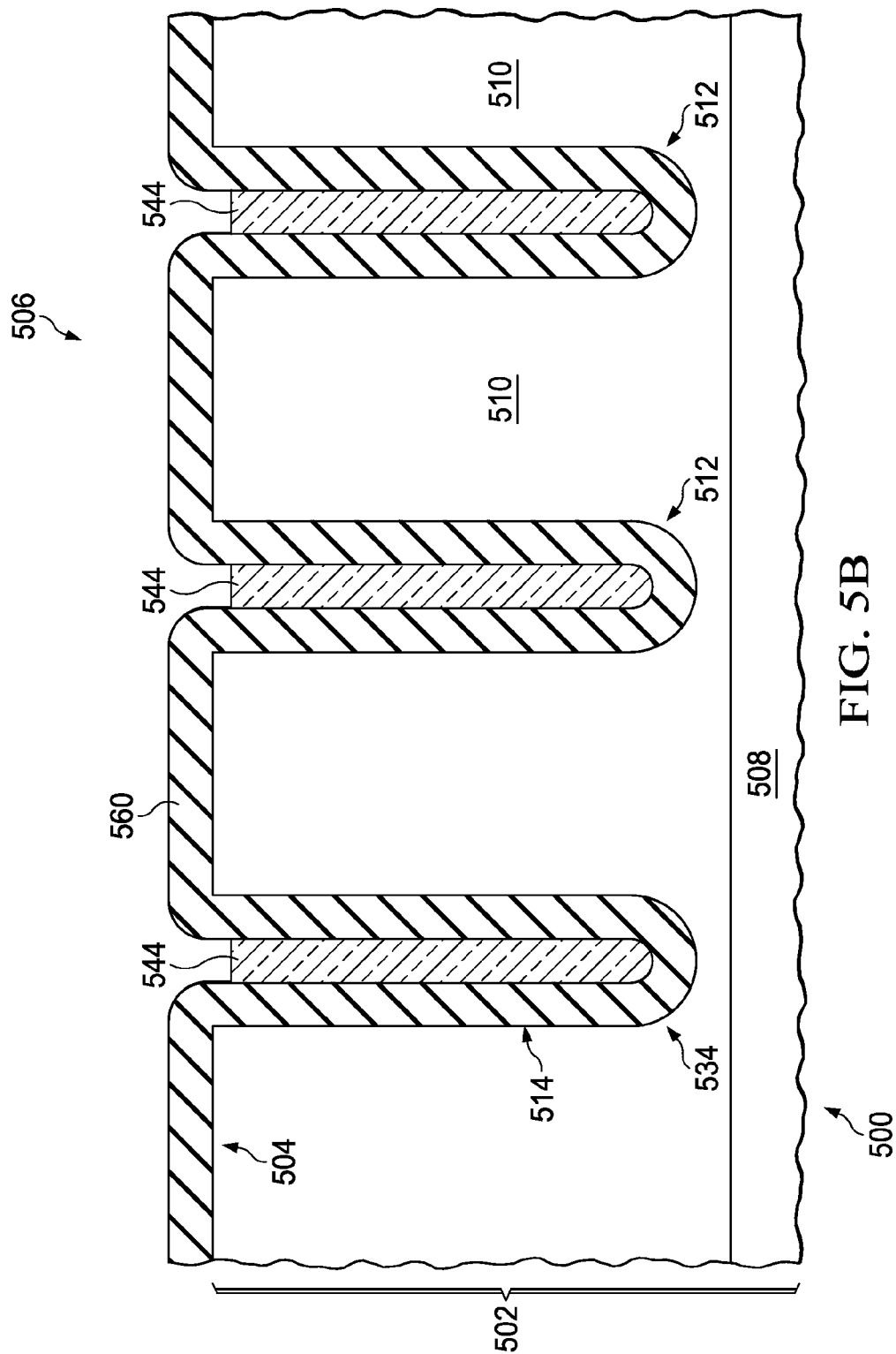

Referring to FIG. 5B, a blanket etchback process removes polysilicon from the first polysilicon layer 544 over the top surface 504 of the substrate 502 so that the first polysilicon layer 544 is within the vertical RESURF trenches 512 and the auxiliary trench 534. In one version of the instant example, a top surface of the first polysilicon layer 544 is approximately coplanar, for example within 200 nanometers, with the top surface 504 of the substrate 502.

Figure 5C:
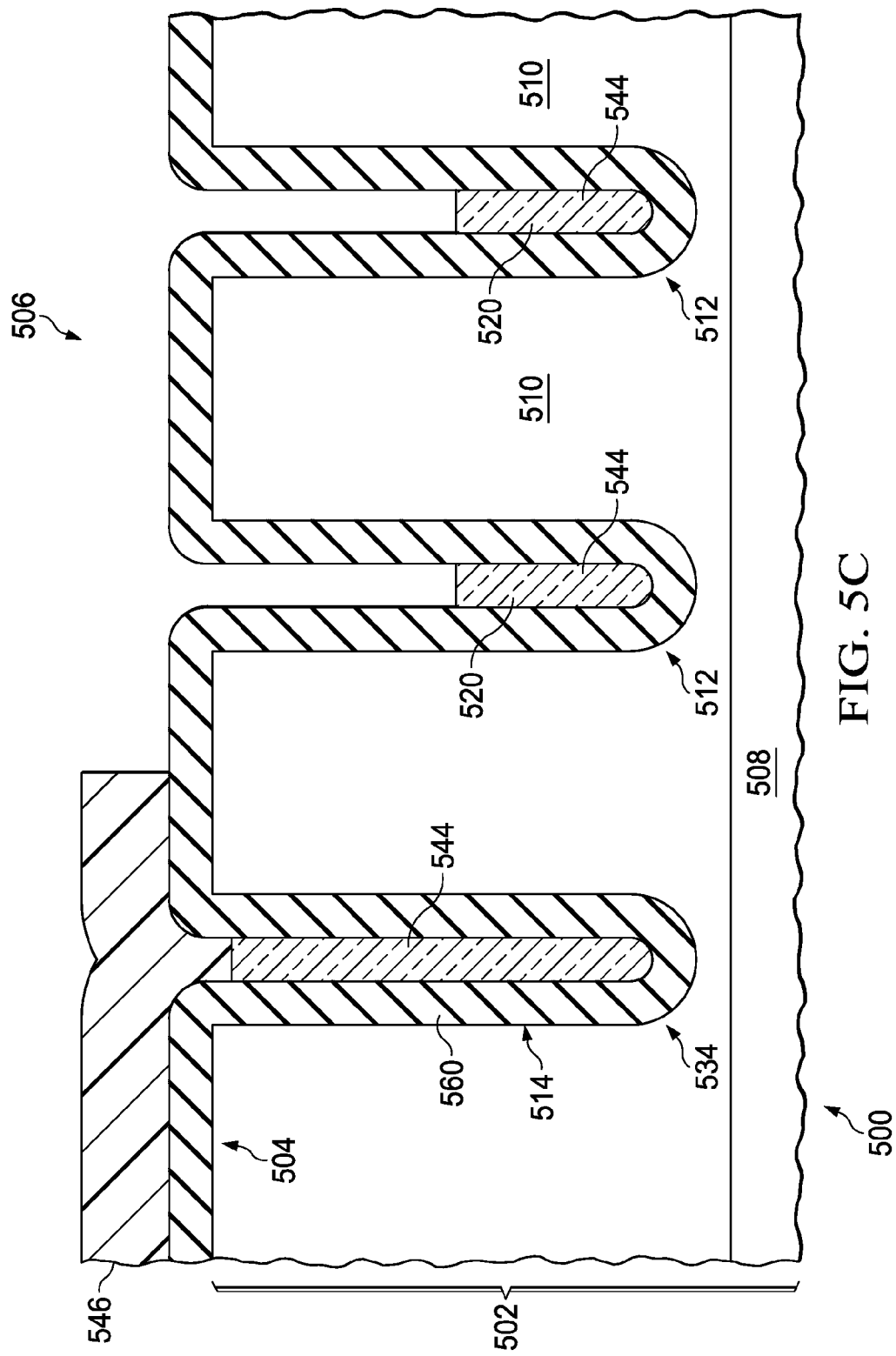

Referring to FIG. 5C, an etchback mask 546 is formed over the auxiliary trench 534 so as to expose the vertical RESURF trenches 512. A polysilicon etch process removes polysilicon from the first polysilicon layer 544 in the vertical RESURF trenches 512 so that remaining polysilicon of the first polysilicon layer 544 forms lower field plates 520 in lower portions of the vertical RESURF trenches 512, which may extend, for example, from approximately midway in the vertical RESURF trenches 512 to bottoms of the vertical RESURF trenches 512. The etchback mask 546 prevents removal of polysilicon from the auxiliary trench 534. The etchback mask 546 is removed after the polysilicon etch process is completed. The first polysilicon layer 544 in the auxiliary trench 534 is contiguous with the first polysilicon layer 544 in the vertical RESURF trenches 512.

Figure 5D:
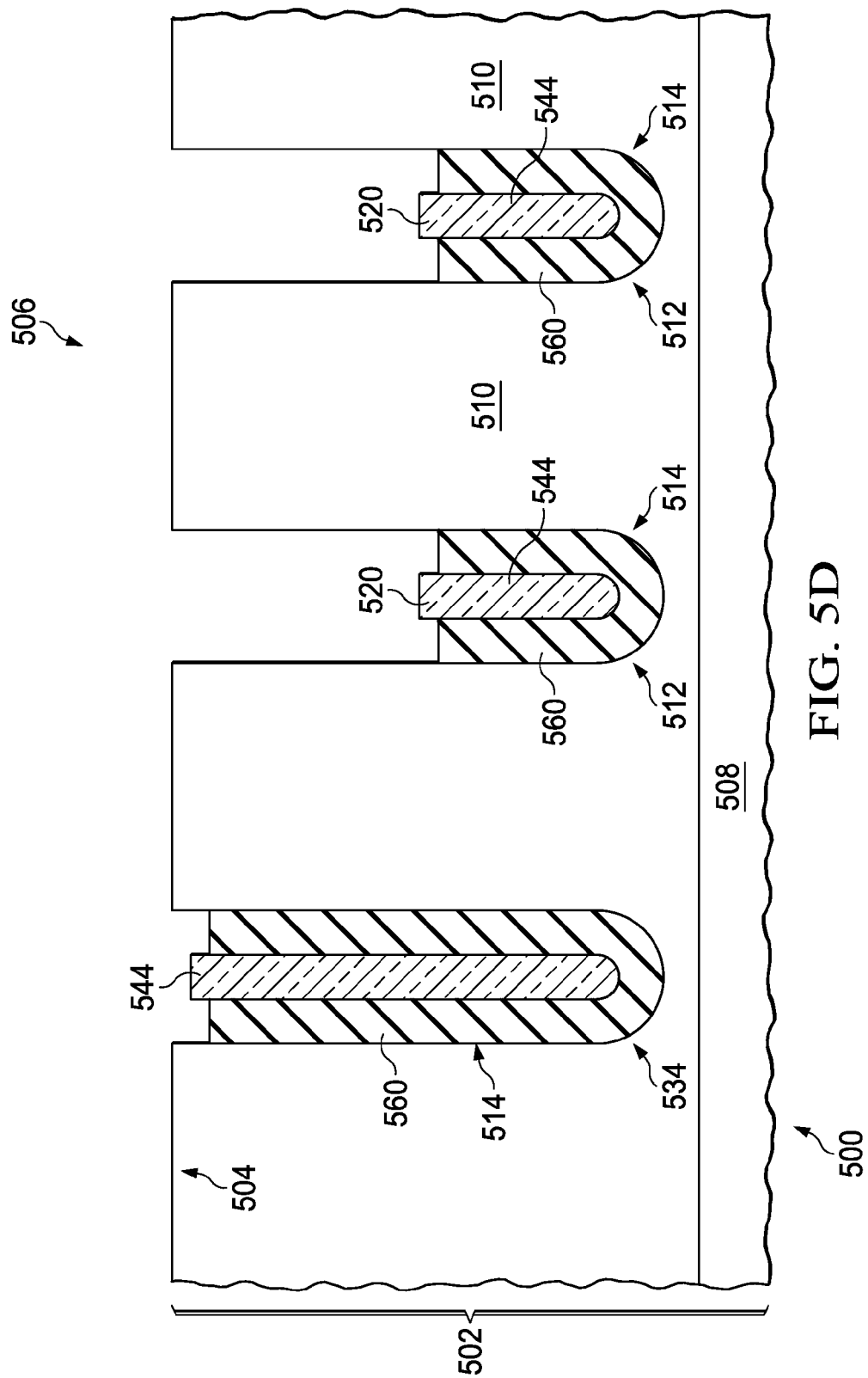

Referring to FIG. 5D, a blanket oxide etchback process removes substantially all of the dielectric trench liner 514 from over the top surface 504 of the substrate 502 and from the vertical RESURF trenches 512 above the lower field plates 520. The lower field plates 520 prevent removal of the dielectric trench liner 514 from the vertical RESURF trenches 512 below tops of the lower field plates 520 and the first polysilicon layer 544 prevents removal of the dielectric trench liner 514 from the auxiliary trench 534. The blanket oxide etchback process may include, for example, a timed wet etch using a buffered hydrofluoric acid solution.

Figure 5E:
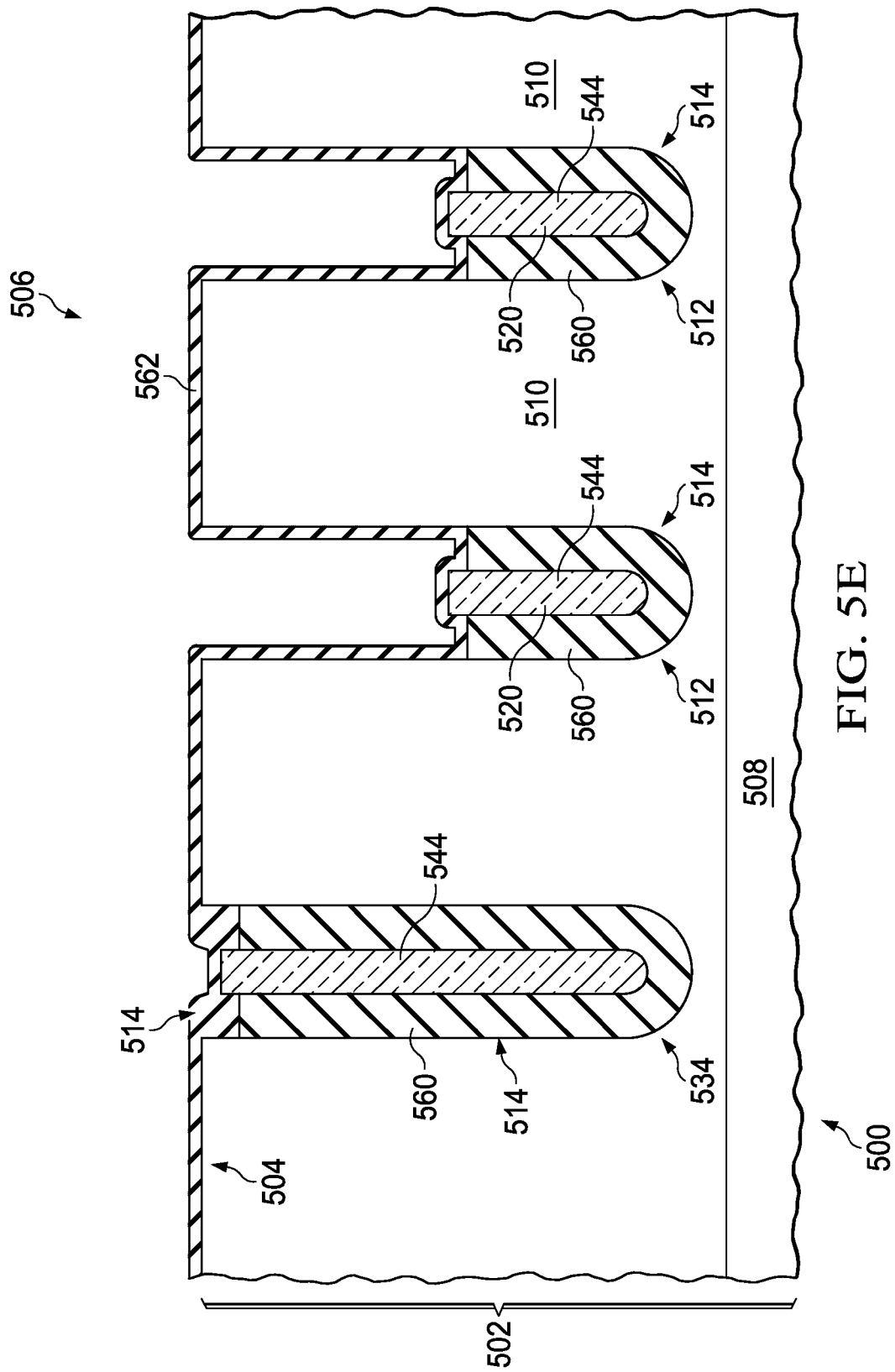

Referring to FIG. 5E, a second dielectric portion 562 of the dielectric trench liner 514 is formed at sidewalls of the vertical RESURF trenches 512 above the lower field plates 520. The second dielectric portion 562 of the dielectric trench liner 514 extends over the top surface 504 of the substrate 502. The second dielectric portion 562 also covers the lower field plates 520. The second dielectric portion 562 includes, for example, a second thermal oxide layer 80 nanometer to 160 nanometers thick, and a second deposited silicon dioxide layer 160 nanometers to 280 nanometers thick, formed on the second thermal oxide layer.

Figure 5F:
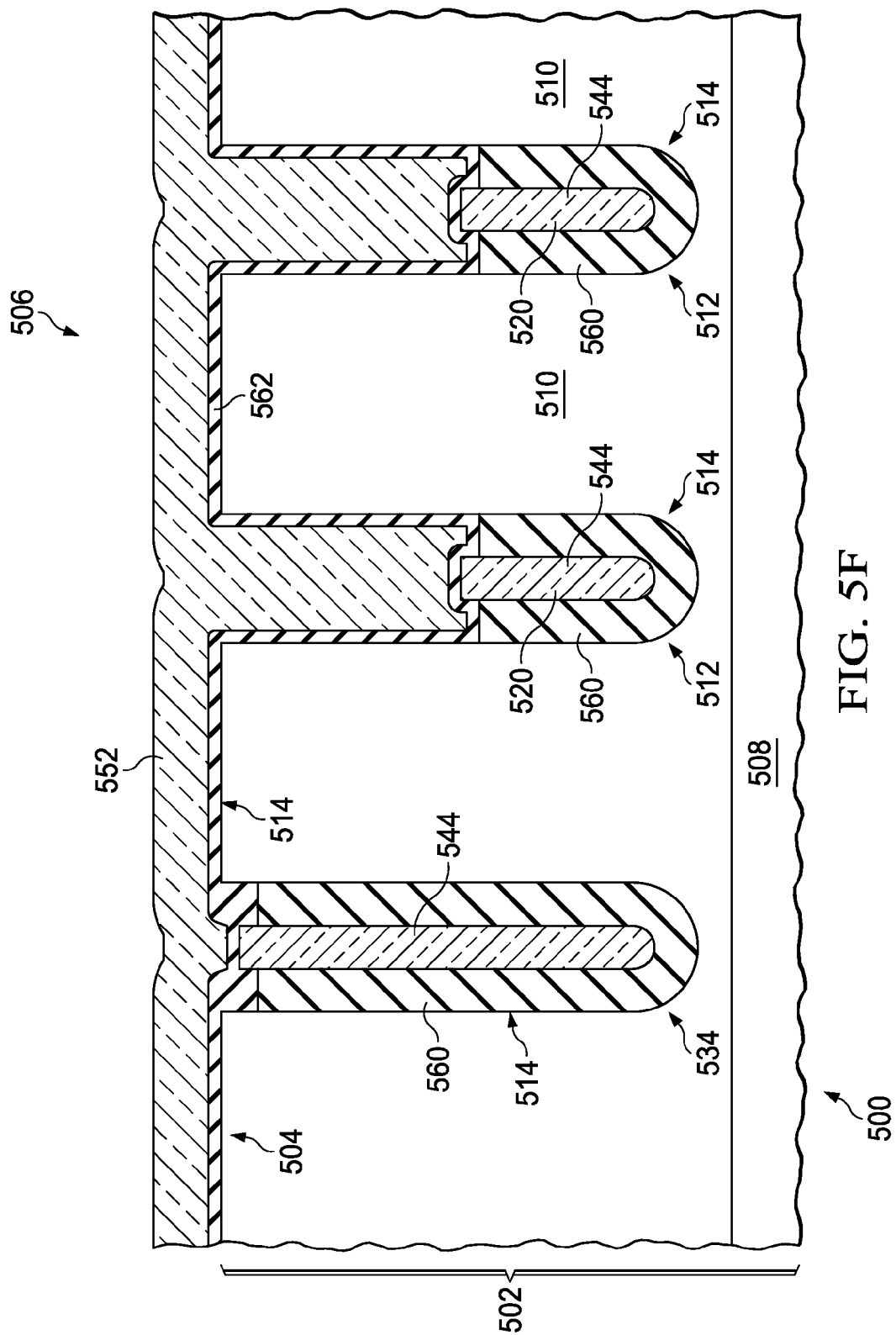

Referring to FIG. 5F, a second polysilicon layer 552 is formed as described in reference to FIG. 2F on an existing top surface of the semiconductor device 500 and in the vertical RESURF trenches 512. The second polysilicon layer 552 may be for example, 550 nanometers to 700 nanometers thick over the top surface 504 of the substrate 502. The second polysilicon layer 552 is electrically isolated from the lower field plates 520 by the second dielectric portion 562 of the dielectric trench liners 514.

Figure 5G:
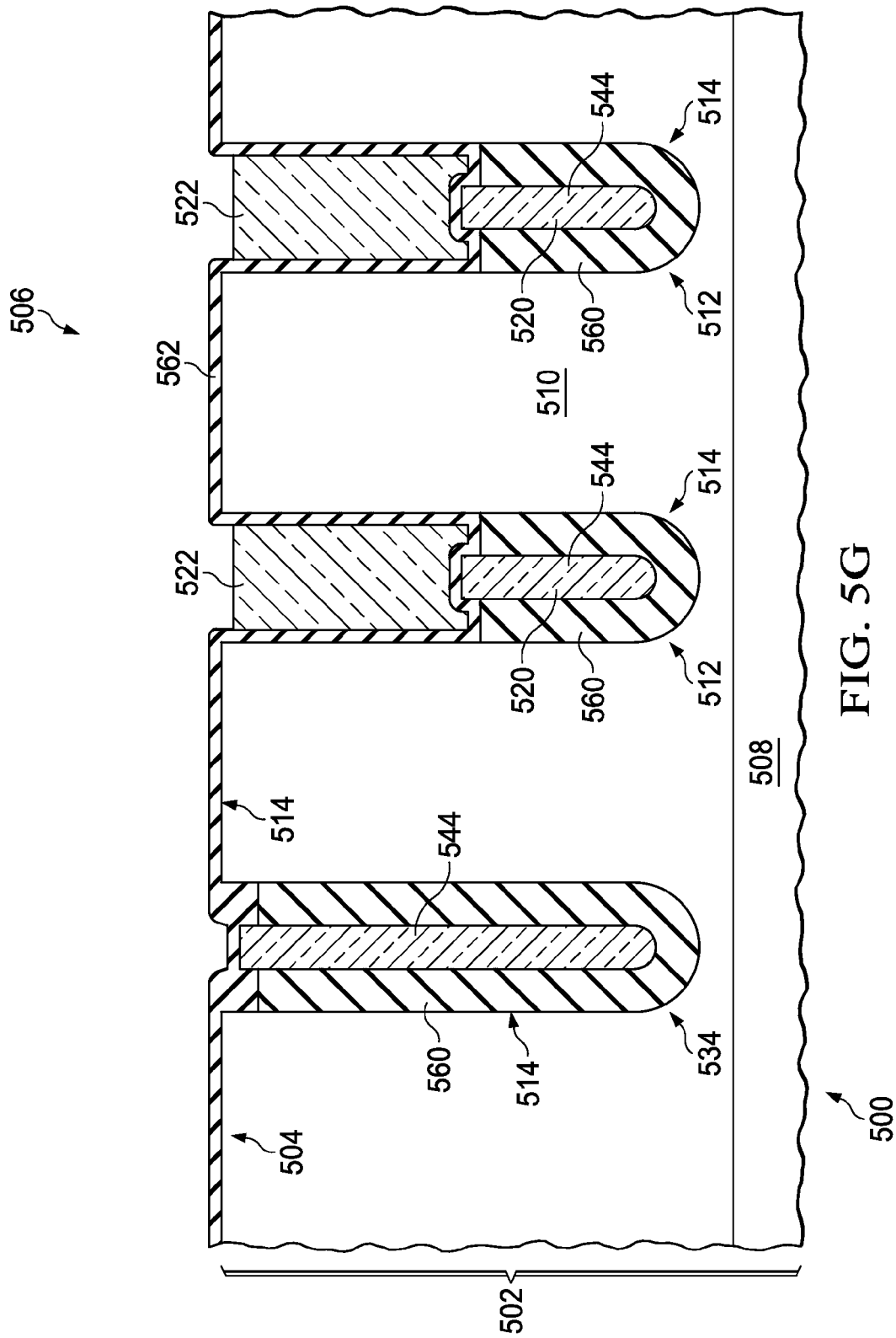

Referring to FIG. 5G, a blanket polysilicon etchback process removes polysilicon from the second polysilicon layer 552 of FIG. 5F over the top surface 504 of the substrate 502, leaving the second polysilicon layer 552 in the vertical RESURF trenches 512, forming upper field plates 522 above the lower field plates 520. A top surface of the upper field plates 522 is approximately coplanar, for example within 200 nanometers, of the top surface 504 of the substrate 502. The dielectric trench liners 514 are mostly silicon dioxide, and are free of a silicon nitride or silicon carbide etch stop layer. The dielectric trench liners 514 are thicker between the lower field plates 520 and the vertical drift region 510 than between the upper field plates 522 and the vertical drift region 510. Forming the dielectric trench liners 514 as described in reference to FIG. 5A through FIG. 5G may advantageously provide a desired level of thickness control for the second dielectric portion 562 of the dielectric trench liners 514.

Figure 5H:
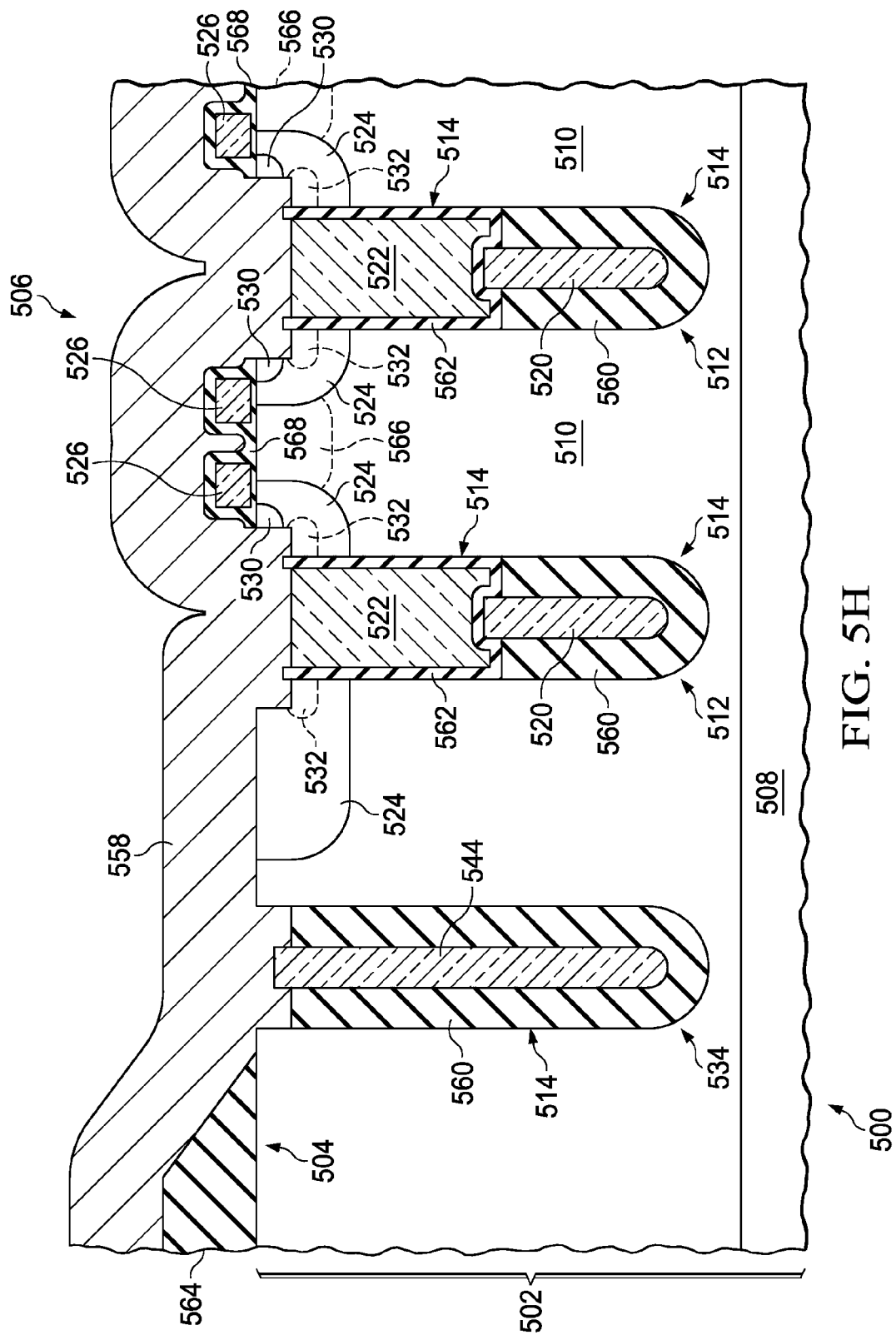

Referring to FIG. 5H, drain oxide 564 is formed over the auxiliary trench 534 and exposes the vertical RESURF trenches 512. The drain oxide 564 may be 200 nanometers to 400 nanometers thick and may have a sloped edge. Gates 526 are formed over a gate dielectric layer on the top surface 504 of the substrate 502. The gates 526 are formed between the vertical RESURF trenches 512 and are electrically isolated from the upper field plates 522 and the lower field plates 520.

N-type lightly doped drain (LDD) regions 566 are formed in the substrate 502 adjacent to the gates 526. A p-type body region 524 is formed in the substrate 502 extending under the gate 526. An n-type source region 530 is formed in the substrate 502 adjacent to the gate 526 opposite from the LDD regions 566 and separated from the vertical drift region 510 by the body region 524. Heavily doped p-type body contact regions 532 may optionally be formed in the body region 524. A pre-metal dielectric layer 568, for example 70 nanometers to 200 nanometers of PECVD silicon dioxide, is formed over the gates 526.

A source electrode 558 is formed over the substrate 502 so as to make electrical contact to the source region 530 and to the body region 524, through the body contact regions 532 if present. The source electrode 558 further makes electrical contact to the upper field plates 522 at tops of the vertical RESURF trenches 512 and to the first polysilicon layer 544 in the auxiliary trench 534, which is contiguous with the lower field plates 520 in the vertical RESURF trenches 512. The source electrode 558 may include a contact metal layer and a layer of aluminum or copper as described in reference to FIG. 2H. A contact trench may be formed at the top surface 504 of the substrate 502 so as to expose the body contact regions 532, the upper field plates 522 and the first polysilicon layer 544 in the auxiliary trench 534.

Figure 6A:
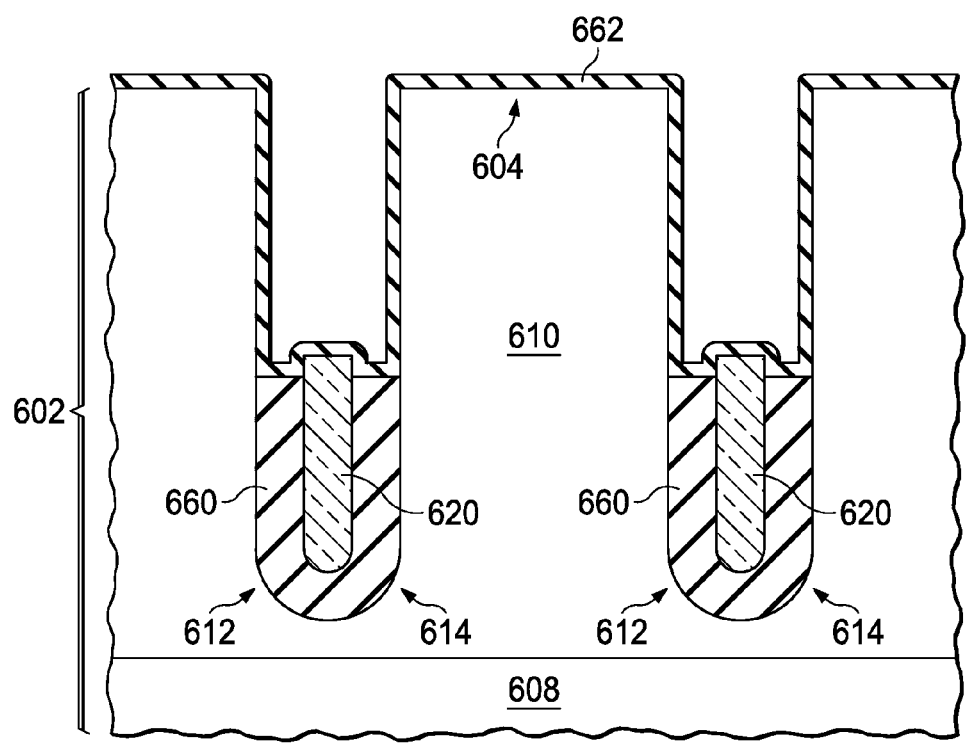
FIG. 6A through FIG. 6D are cross sections of a semiconductor device containing an exemplary vertical MOS transistor, depicted in successive stages of a variation of the fabrication process sequence described in reference to FIG. 5A through FIG. 5H.

FIG. 6A through FIG. 6D are cross sections of a semiconductor device containing an exemplary vertical MOS transistor, depicted in successive stages of a variation of the fabrication process sequence described in reference to FIG. 5A through FIG. 5H. Referring to FIG. 6A, the semiconductor device 600 is formed in and on a substrate 602 which includes a semiconductor extending to a top surface 604 of the substrate 602. The vertical MOS transistor 606 includes an n-type drain contact region 608 disposed in the substrate 602 below an n-type vertical drift region 610 of the vertical MOS transistor 606. Vertical RESURF trenches 612 are formed in the substrate 602 on at least two opposite sides of the vertical drift region 610. A first dielectric portion 660 of a dielectric trench liner 614 is formed at sidewalls and bottom of the vertical RESURF trenches 612, and at the top surface 604 of the substrate 602, as described in reference to FIG. 5A.

Lower field plates 620 are formed in lower portions of the vertical RESURF trenches 612 which may extend, for example, from approximately midway in the vertical RESURF trenches 612 to bottoms of the vertical RESURF trenches 612. The lower field plates 620 may be formed using blanket etches instead of the patterned etch process described in reference to FIG. 5C.

A blanket oxide etchback process removes substantially all of the dielectric trench liner 614 from over the top surface 604 of the substrate 602 and from the vertical RESURF trenches 612 above the lower field plates 620, as described in reference to FIG. 5D. The lower field plates 620 prevent removal of the dielectric trench liner 614 from the vertical RESURF trenches 612 below tops of the lower field plates 620. A second dielectric portion 662 of the dielectric trench liner 614 is formed at sidewalls of the vertical RESURF trenches 612 above the lower field plates 620, as described in reference to FIG. 5E. The second dielectric portion 662 of the dielectric trench liner 614 extends over the top surface 604 of the substrate 602. The second dielectric portion 662 also covers the lower field plates 620.

Figure 6B:
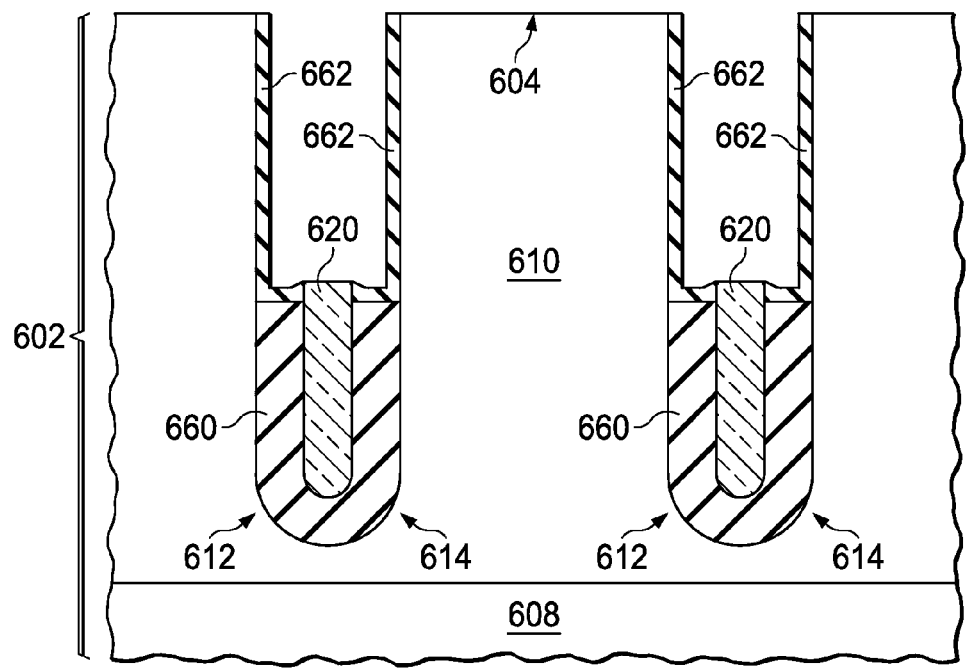

Referring to FIG. 6B, an anisotropic oxide etchback process removes the second dielectric portion 662 of the dielectric trench liner 614 from the tops of the lower field plates 620 and leaves a majority portion, and possibly substantially all, of the second dielectric portion 662 on the sidewalls of the vertical RESURF trenches 612. The second dielectric portion 662 may be removed from over the top surface 604 of the substrate 602 by the anisotropic oxide etchback process.

Figure 6C:
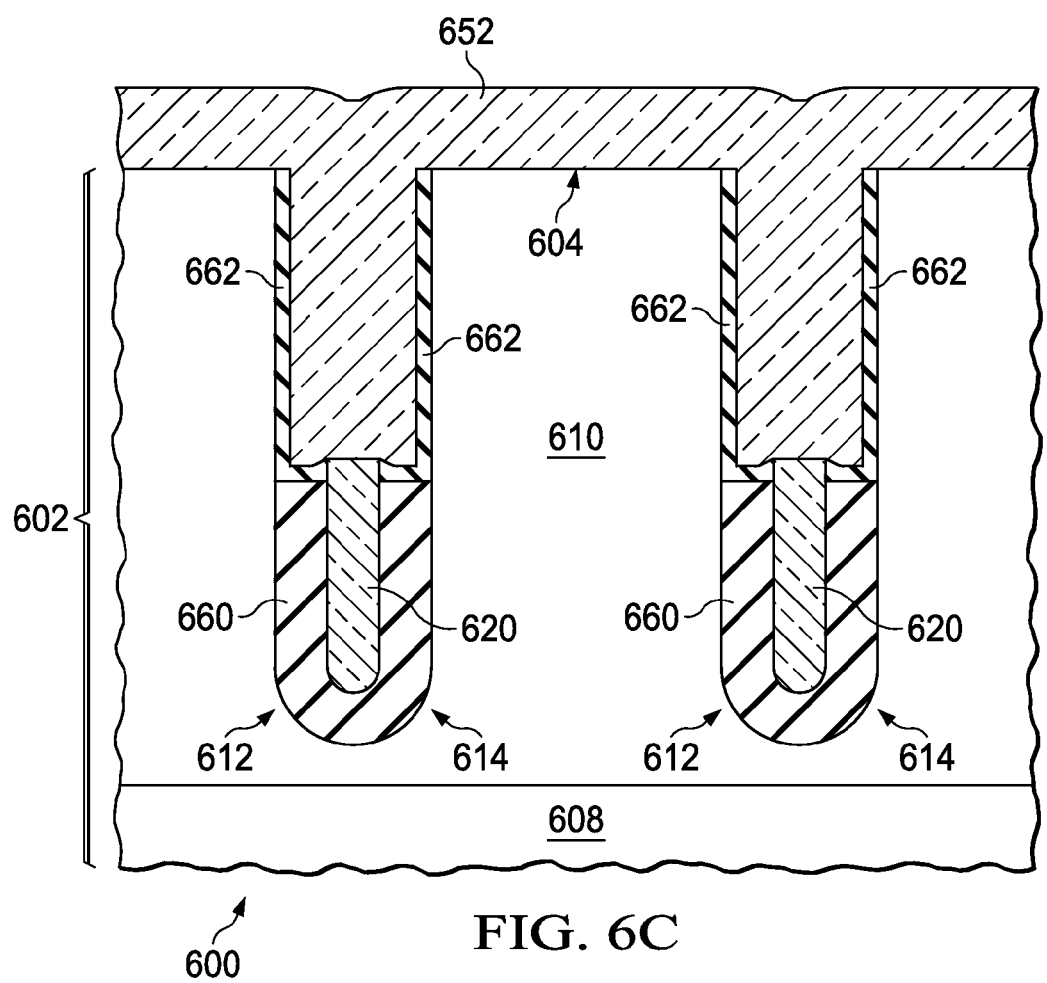

Referring to FIG. 6C, a polysilicon layer 652 is formed on an existing top surface of the semiconductor device 600 and in the vertical RESURF trenches 612, as described in reference to FIG. 5F. In the instant example, the polysilicon layer 652 makes electrical contact to the tops of the lower field plates 620.

Figure 6D:
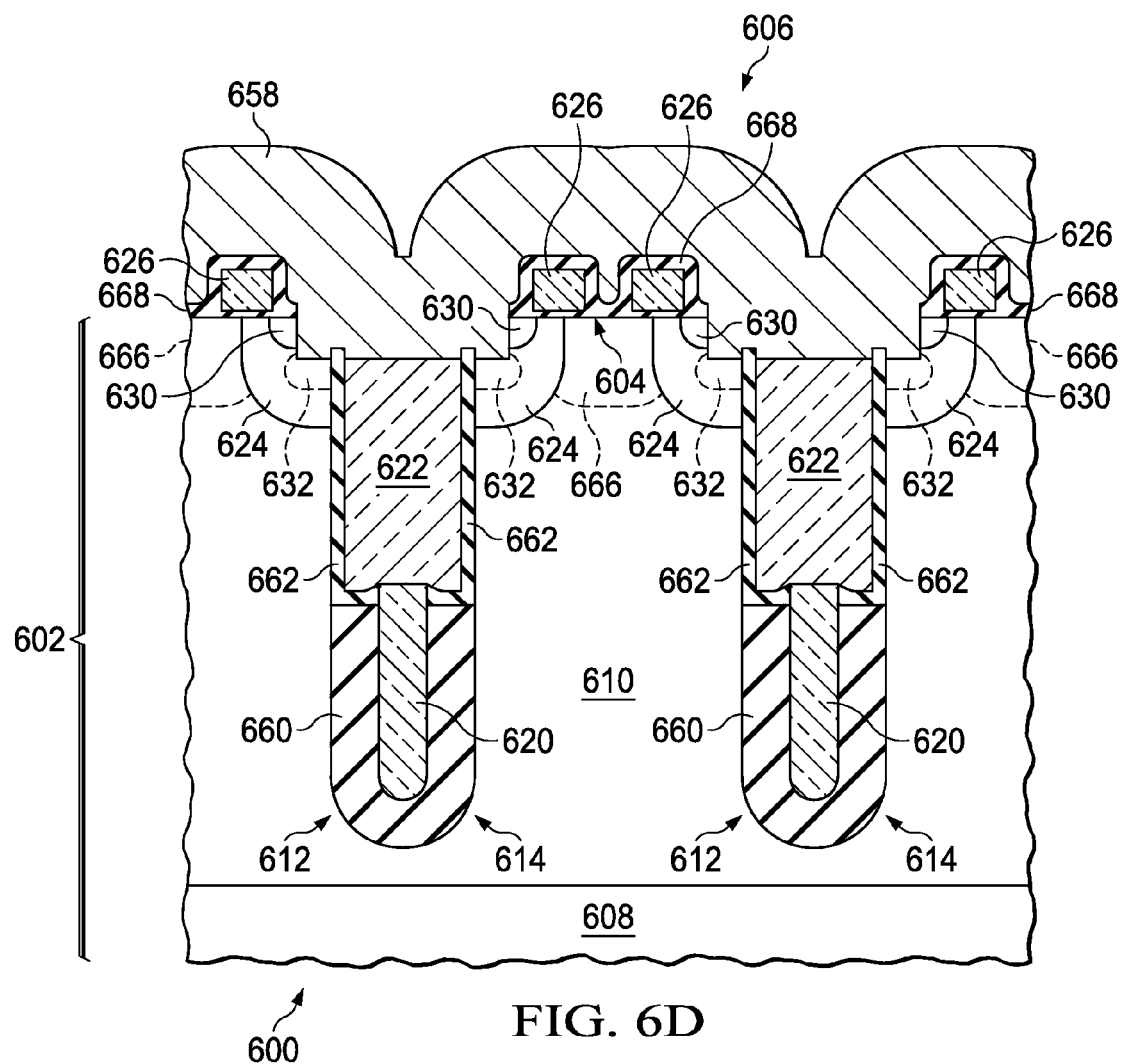

Referring to FIG. 6D, fabrication of the semiconductor device is continued as described in reference to FIG. 5H. A polysilicon etchback process removes the polysilicon layer 652 of FIG. 6C from over the top surface 604 of the substrate 602 to form upper field plates 622 in the vertical RESURF trenches 612 above the lower field plates 620. A top surface of the upper field plates 622 is approximately coplanar, for example within 200 nanometers, of the top surface 604 of the substrate 602. The dielectric trench liners 614 are mostly silicon dioxide, and are free of a silicon nitride or silicon carbide etch stop layer. The dielectric trench liners 614 are thicker between the lower field plates 620 and the vertical drift region 610 than between the upper field plates 622 and the vertical drift region 610. In the instant embodiment, the upper field plates 622 make direct electrical connection to the lower field plates 620, which may advantageously reduce an area required for the semiconductor device 600.

Gates 626 are formed over a gate dielectric layer on the top surface 604 of the substrate 602. The gates 626 are formed between the vertical RESURF trenches 612 and are electrically isolated from the upper field plates 622 and the lower field plates 620. N-type LDD regions 666 are formed in the substrate 602 adjacent to the gates 626. A p-type body region 624 is formed in the substrate 602 extending under the gates 626. An n-type source region 630 is formed in the substrate 602 adjacent to the gates 626 opposite from the LDD regions 666 and separated from the vertical drift region 610 by the body region 624. Heavily doped p-type body contact regions 632 may optionally be formed in the body region 624. A source electrode 658 is formed over the substrate 602 as described in reference to FIG. 5H so as to make electrical contact to the source region 630 and to the body region 624, through the body contact regions 632 if present. The source electrode 658 further makes electrical contact to the upper field plates 622 at tops of the vertical RESURF trenches 612. In the instant embodiment, the upper field plates 622 make direct electrical connection to the lower field plates 620, which may advantageously reduce an area required for the semiconductor device 600. A contact trench may be formed at the top surface 604 of the substrate 602 so as to expose the body contact regions 632 and the upper field plates 622.

Figure 7:
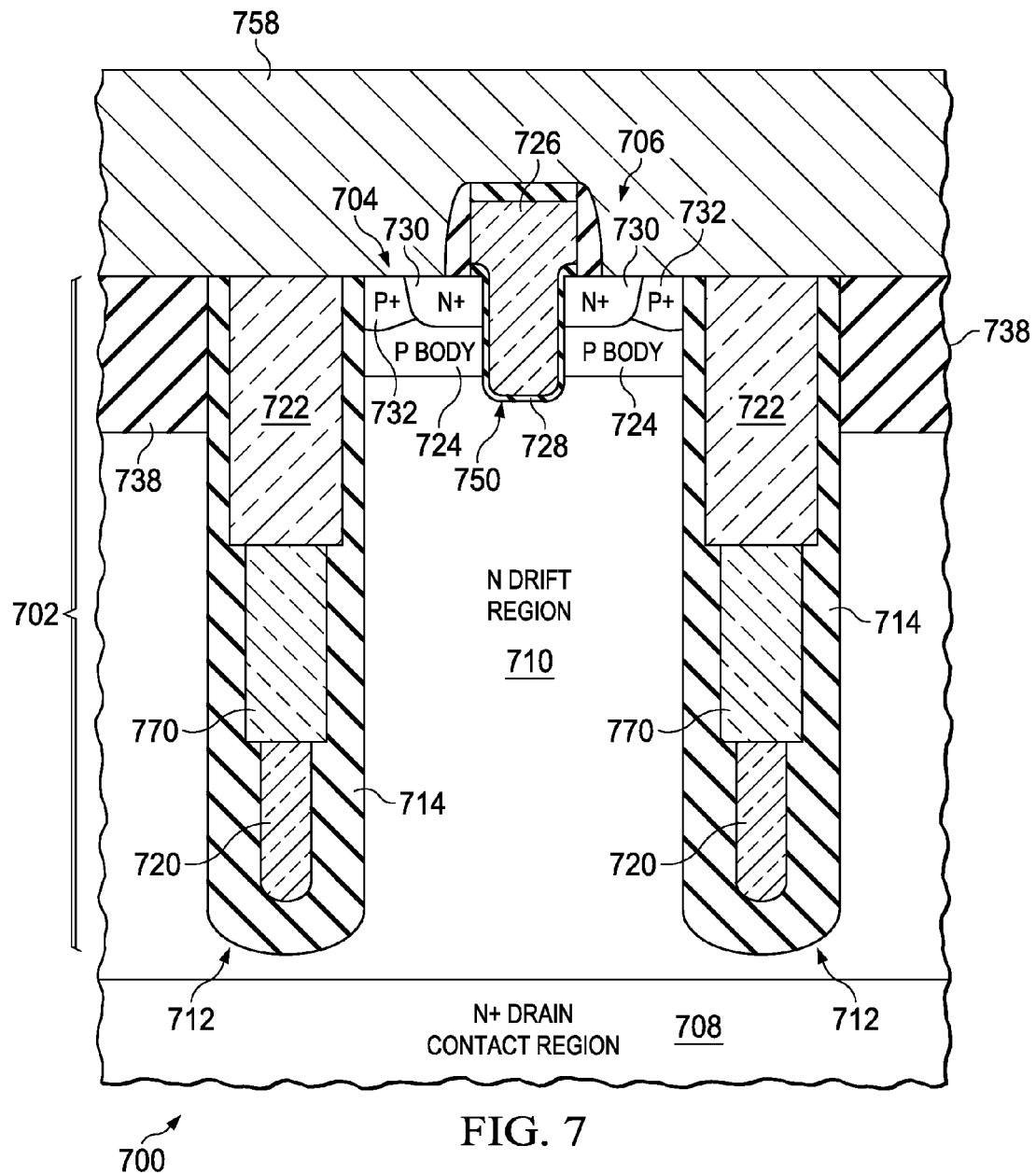
FIG. 7 is a cross section of a semiconductor device containing another exemplary vertical MOS transistor.

FIG. 7 is a cross section of a semiconductor device containing another exemplary vertical MOS transistor. The semiconductor device 700 is formed in and on a substrate 702 which includes a semiconductor extending to a top surface 704 of the substrate 702. The vertical MOS transistor 706 includes an n-type drain contact region 708 disposed in the substrate 702 below an n-type vertical drift region 710 of the vertical MOS transistor 706. The vertical MOS transistor 706 includes at least one vertical RESURF trench 712, of which an instance is disposed on opposite sides of the vertical drift region 710, extending to near the top surface 704 of the substrate 702. Each vertical RESURF trench 712 has a dielectric trench liner 714 disposed on sidewalls and a bottom of the vertical RESURF trench 712, as described in reference to FIG. 1.

In the instant example, each vertical RESURF trench 712 includes a lower field plate 720 on the dielectric trench liner 714 disposed in a lower portion of the vertical RESURF trench 712 which extends to a bottom of the vertical RESURF trench 712. Each vertical RESURF trench 712 also includes an upper field plate 722 on the dielectric trench liner 714 which extends to a top of the vertical RESURF trench 712. Each vertical RESURF trench 712 further includes a central field plate 770 on the dielectric trench liner 714 disposed between the lower field plate 720 and the upper field plate 722. The dielectric trench liners 714 are thicker between the lower field plates 720 and the vertical drift region 710 than between the central field plates 770 and the vertical drift region 710, and thicker between the central field plates 770 and the vertical drift region 710 than between the upper field plates 722 and the vertical drift region 710. The dielectric trench liners 714, the lower field plates 720, the central field plates 770, and the upper field plates 722 may be formed, for example, according to any of the examples described herein.

A gate 726 and a gate dielectric layer 728 are formed in a gate trench 750 over the vertical drift region 710 so that the gate 726 does not contact the upper field plates 722, the central field plates 770 or the lower field plates 720. A p-type body region 724 is formed in the substrate 702 over the vertical drift region 710 and abutting the gate trench 750. An n-type source region 730 is formed in the substrate 702 abutting the gate trench 750 opposite from the vertical drift region 710. Heavily doped p-type body contact regions 732 may optionally be formed in the body region 724 at the top surface 704 of the substrate 702. A source electrode 758 is formed over the substrate 702 so as to make electrical contact to the source region 730 and to the body region 724, through the body contact regions 732 if present.

The source electrode 758 makes electrical contact to the upper field plates 722 at tops of the vertical RESURF trenches 712. The source electrode 758 is also electrically coupled to the central field plates 770 and to the lower field plates 720. In a version of the instant example depicted in FIG. 7, the upper field plates 722 make direct electrical connection to the central field plates 770, which in turn make direct electrical connection to the lower field plates 720. In other versions of the instant example, the source electrode 758 may be electrically coupled to the central field plates 770 and to the lower field plates 720 through field plate material in auxiliary trenches, as described herein.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A semiconductor device, comprising:
a substrate comprising semiconductor material;
a vertical metal oxide semiconductor (MOS) transistor, including:
a vertical drift region having a first conductivity type disposed in said semiconductor material of said substrate;
at least one vertical RESURF trench in said substrate, such that instances of said vertical RESURF trench are disposed on opposite sides of said vertical drift region, in which each instance of said vertical RESURF trench includes:
a dielectric trench liner disposed on sidewalls and a bottom of said vertical RESURF trench;
a lower field plate disposed on said dielectric trench liner in a lower portion of said vertical RESURF trench; and
an upper field plate disposed on said dielectric trench liner above said lower field plate, said dielectric trench liner being thicker between said lower field plate and said vertical drift region than said upper field plate and said vertical drift region;
a drain contact region having said first conductivity type disposed in said substrate below said vertical RESURF trench;
a gate disposed above said vertical drift region between said instances of said vertical RESURF trench disposed on opposite sides of said vertical drift region, such that said gate is electrically isolated from said upper field plate and said lower field plate;
a source region having said first conductivity type disposed in said substrate above said vertical drift region and separated from said vertical drift region by a body region having a second conductivity type opposite from said first conductivity type; and
a source electrode which is electrically coupled to said source region, said upper field plate and said lower field plate.

2. The semiconductor device of claim 1, further comprising an auxiliary trench disposed in said substrate, said auxiliary trench having a depth substantially equal to said vertical RESURF trench, said auxiliary trench containing field plate material contiguous with said lower field plate, said field plate material making contact with said source electrode.

3. The semiconductor device of claim 1, in which a top of said lower field plate is directly electrically connected to a bottom of said upper field plate.

4. The semiconductor device of claim 1, in which said dielectric trench liner is free of a silicon nitride etch stop layer and free of a silicon carbide etch stop layer.

5. The semiconductor device of claim 1, in which said upper field plate and said lower field plate are polysilicon.

6. The semiconductor device of claim 1, in which said first conductivity type is n-type and said second conductivity type is p-type.

7. The semiconductor device of claim 1, in which said dielectric trench liner contacting said lower field plate includes a layer of thermal oxide and a layer of deposited silicon dioxide on said layer of thermal oxide.

8. A method of forming a semiconductor device, comprising the steps of:
- providing a substrate comprising semiconductor material;
- forming a vertical MOS transistor, by a process comprising the steps:
  - forming a drain contact region having a first conductivity type disposed in said substrate below a top surface of said substrate;
  - forming a vertical drift region having said first conductivity type in said semiconductor material of said substrate above said drain contact region;
  - forming at least one vertical RESURF trench in said substrate above said drain contact region, such that instances of said vertical RESURF trench are formed on opposite sides of said vertical drift region, by a process comprising the steps:
    - removing said semiconductor material from said substrate in an area for said vertical RESURF trench;
    - forming a dielectric trench liner on sidewalls and a bottom of said vertical RESURF trench;
    - forming a lower field plate on said dielectric trench liner in a lower portion of said vertical RESURF trench;
    - removing at least a portion of said dielectric trench liner above said lower field plate; and
    - forming an upper field plate on said dielectric trench liner above said lower field plate, so that said dielectric trench liner is thicker between said lower field plate and said vertical drift region than between said upper field plate and said vertical drift region;
  - forming a gate above said vertical drift region between said instances of said vertical RESURF trench, such that said gate is electrically isolated from said upper field plate and said lower field plate;
  - forming a body region above said vertical drift region, said body region having a second conductivity type opposite from said first conductivity type;
  - forming a source region having said first conductivity type in said substrate above said vertical drift region so that said source region is separated from said vertical drift region by said body region; and
  - forming a source electrode which is electrically coupled to said source region, said upper field plate and said lower field plate.

9. The method of claim 8, in which said step of removing at least a portion of said dielectric trench liner above said lower field plate is performed so that at least a portion of a layer of thermal oxide is left on said sidewalls above said upper field plate.

10. The method of claim 8, further comprising the step of forming a deposited oxide layer in said vertical RESURF trench after said step of removing at least said portion of said dielectric trench liner above said lower field plate.

11. The method of claim 8, further comprising the steps of:
- forming a layer of thermal oxide in said vertical RESURF trench after said step of removing at least said portion of said dielectric trench liner above said lower field plate, so that said layer of thermal oxide covers a top of said lower field plate; and
- removing said layer of thermal oxide from said top of said lower field plate before forming said upper field plate, so that said top of said lower field plate is directly electrically connected to a bottom of said upper field plate.

12. The method of claim 8, further comprising the steps of:
- forming a layer of deposited oxide in said vertical RESURF trench after said step of removing at least said portion of said dielectric trench liner above said lower field plate, so that said layer of deposited oxide covers a top of said lower field plate; and
- removing said layer of deposited oxide from said top of said lower field plate before forming said upper field plate, so that said top of said lower field plate is directly electrically connected to a bottom of said upper field plate.

13. The method of claim 8, in which said upper field plate is formed on a remaining portion of said dielectric trench liner after said step of removing said portion of said dielectric trench liner above said lower field plate, so that said dielectric trench liner is free of an additional oxide layer formed after said step of removing said portion of said dielectric trench liner above said lower field plate.

14. The method of claim 8, in which said step of removing said portion of said dielectric trench liner above said lower field plate is performed so that substantially all of said dielectric trench liner above said lower field plate is removed; and
- further comprising the step of forming an additional oxide layer on said sidewalls of said vertical RESURF trench prior to said step of forming said upper field plate.

15. The method of claim 8, in which said gate and said upper field plate are formed of a same layer of polysilicon.

16. The method of claim 8, further comprising the steps of:
- forming an auxiliary trench concurrently with said vertical RESURF trench;
- forming field plate material in said auxiliary trench concurrently with said lower field plate such that said field plate material in said auxiliary trench is contiguous with said lower field plate, and such that said source electrode is electrically coupled to said lower field plate through said field plate material in said auxiliary trench.

17. The method of claim 8, in which said step of forming said dielectric trench liner includes forming a layer of thermal oxide on said sidewalls of said vertical RESURF trench and forming a layer of deposited silicon oxide on said layer of thermal oxide.

18. The method of claim 8, in which said step of forming said dielectric trench liner is performed so that dielectric trench liner is free of a silicon nitride etch stop layer and free of a silicon carbide etch stop layer.

19. The method of claim 8, in which said first conductivity type is n-type and said second conductivity type is p-type.

* * * * *